(12) United States Patent
Kurioka

(10) Patent No.: US 7,369,394 B2
(45) Date of Patent: May 6, 2008

(54) VARIABLE CAPACITOR, CIRCUIT MODULE, AND COMMUNICATIONS APPARATUS

(75) Inventor: Hideharu Kurioka, Kyoto (JP)

(73) Assignee: Kyocera Corporation, Kyoto (JP)

( * ) Notice: Subject to any disclaimer, the term of this patent is extended or adjusted under 35 U.S.C. 154(b) by 150 days.

(21) Appl. No.: 11/330,529

(22) Filed: Jan. 12, 2006

(65) Prior Publication Data
US 2006/0151853 A1    Jul. 13, 2006

(30) Foreign Application Priority Data
Jan. 13, 2005    (JP) .......................... P2005-006806

(51) Int. Cl.
*H01G 5/00* (2006.01)
(52) U.S. Cl. .................. 361/277; 361/272; 361/278; 361/283.3; 361/290; 361/292
(58) Field of Classification Search ........ 361/272–273, 361/277–278, 281, 286–287, 290–292, 299.1, 361/283.3
See application file for complete search history.

(56) References Cited

U.S. PATENT DOCUMENTS 6,215,644 B1 * 4/2001 Dhuler ...................... 361/280
6,285,542 B1 * 9/2001 Kennedy et al. ............ 361/328
6,674,321 B1 * 1/2004 York .......................... 327/586
7,002,435 B2 * 2/2006 Mishima et al. ............ 333/174
7,092,232 B2 * 8/2006 Yamagata et al. .......... 361/277

FOREIGN PATENT DOCUMENTS

JP    11-260667    9/1999

* cited by examiner

*Primary Examiner*—Nguyen T. Ha
(74) *Attorney, Agent, or Firm*—Hogan & Hartson LLP

(57) ABSTRACT

A variable capacitor includes a supporting substrate and a plurality of variable capacitance elements, and bias lines. The plurality of variable capacitance elements is formed on the supporting substrate, each of which is composed of a lower-laid first electrode layer, an upper-laid second electrode layer, and a dielectric layer sandwiched therebetween whose dielectric constant changes with direct current bias voltage. In the variable capacitance elements which are adjacent to each other, the second electrode layer of a first variable capacitance element and the first electrode layer of a second variable capacitance element are electrically connected in series with each other. The bias lines each include at least one of resistance component and inductance component for applying the direct current bias voltage. The variable capacitance elements are each connected to the bias lines.

8 Claims, 19 Drawing Sheets

VARIABLE CAPACITOR, CIRCUIT MODULE, AND COMMUNICATIONS APPARATUS

BACKGROUND OF THE INVENTION

1. Field of the Invention

The present invention relates to a variable capacitor which can operate satisfactorily in a high-frequency region with a low dielectric loss, as well as to a circuit module and a communications apparatus. More particularly, the invention relates to an easy-to-handle variable capacitor that has the advantages of allowing great capacitive variation through application of a voltage; minimizing nonlinear distortion which is caused by a high-frequency signal; offering sufficiently high electrical strength; and functioning properly regardless of the polarity of a voltage to be applied, as well as to a circuit module and a communications apparatus that employ said variable capacitor.

2. Description of the Related Art

Conventionally, a silicon oxide ($SiO_2$) thin film, a silicon nitride ($Si_3N_4$) thin film, and a tantalum oxide ($Ta_2O_5$) thin film have commonly been used for forming an IC-adaptable dielectric thin film capacitor. As compared with these thin films, a strontium titanate ($SrTiO_3$: paraelectric substance) thin film and a barium strontium titanate (($Ba,Sr)TiO_3$: ferroelectric substance) thin film each exhibit a higher dielectric constant, and thus show promise nowadays for forming an IC-adaptable dielectric thin film capacitor that is smaller in area than ever.

There have been proposed to date thin-film capacitors that employ, as their dielectric layers, a ferroelectric oxide thin film having a perovskite structure such as strontium titanate or barium strontium titanate (for example, refer to Japanese Unexamined Patent Publication JP-A 11-260667 (1999)).

FIG. 18 is a sectional view showing a thin-film capacitor disclosed in JP-A 11-260667. The thin-film capacitor 200 is constructed by forming, on a supporting substrate 201, a first electrode layer 202, a thin-film dielectric layer 203, and a second electrode layer 204 one after another in the order named by deposition. More specifically, on the supporting substrate 201, a conductor layer to be formed into the first electrode layer 202 is formed by deposition over substantially the entire surface thereof. Then, patterning is performed to impart a desired electrode configuration to the conductor layer, thereby realizing the first electrode layer 202. Next, on the first electrode layer 202 is formed the thin-film dielectric layer 203. The thin-film dielectric layer 203 is formed, by the thin-film forming technique, with a mask placed at a predetermined position, or formed by a spin coating, followed by performing patterning thereon to obtain a desired configuration. The thin-film dielectric layer 203 is then subjected to a heat-hardening treatment on an as needed basis. After that, a conductor layer to be formed into the second electrode layer 204 is formed over substantially the entire surface of the thin-film dielectric layer 203. Then, patterning is performed to impart a desired electrode configuration to the conductor layer, thereby realizing the second electrode layer 204. In this way, the thin-film capacitor 200 is fabricated. Note that, in this construction, the facing region of the thin-film dielectric layer 203 that is actually held between the first electrode layer 202 and the second electrode layer 204 constitutes a capacitance producing region.

In putting the thin-film capacitor 200 into practical use, by adjusting the dielectric constant of the thin-film dielectric layer 203 to be a desired value through application of a predetermined direct current bias voltage (bias signal), it is possible to control the capacitance characteristic appropriately. As a result, the thin-film capacitor 200 is able to function as a variable capacitor normally. Note that, in the thin-film capacitor 200, the first electrode layer 202 and the second electrode layer 204 play two individual roles: an electrode for generating a bias signal-controlled capacitance component of predetermined level and an electrode for feeding a bias signal to the thin-film dielectric layer 203.

In the thin-film capacitor 200 of conventional design, however, as shown in the equivalent circuit diagrams depicted in FIGS. 19A and 19B for example, a bias signal is supplied through an external circuit (bias supply circuit) G disposed on a wiring board on which the thin-film capacitor 200 is mounted.

In FIG. 19A, reference symbol A indicates a point of connection of the thin-film capacitor 200 and the bias supply circuit G. Arranged between the point of connection A and a bias terminal V is a choke coil 205 acting as an inductance component.

On the other hand, in FIG. 19B, in the bias supply circuit G is formed a strip line 206 having a line length of $\lambda/4$, where $\lambda$ indicates the wavelength of a high-frequency signal at which the thin-film capacitor 200 is operated. The strip line 206 has its bias terminal V-side end which is connected to ground. Moreover, between the bias terminal V-side end of the strip line 206 and the ground portion is formed a direct current regulating capacitance element 208.

Because of the above-described configuration, the thin-film capacitor 200, namely the conventional variable capacitor poses the following problems. In order to put the thin-film capacitor 200 into practical use, not only the thin-film capacitor 200 in itself, but also the bias supply circuit G appropriate to the structure and property of the thin-film capacitor 200 needs to be prepared for use. The bias supply circuit G is disposed on the wiring board. It is thus necessary to design the bias supply circuit G in conformity with the thin-film capacitor 200 to be mounted on the wiring board. In this case, very complicated and time-consuming process is required to make adjustment to the bias supply circuit G. Furthermore, the thin-film capacitor 200 and the bias supply circuit G are fabricated independently of each other. This leads to an undesirable increase in the size of the entire construction.

As another problem, in the conventional thin-film capacitor 200, the high-frequency signal terminal and the bias terminal V are used in an interchangeable manner. It is thus necessary to separate a high-frequency component (signal component of a high-frequency signal) and a direct current component (bias signal) from each other by using an additional component such as the choke coil 205 in an external circuit.

As still another problem, the capacitance of the thin-film capacitor 200 cannot be caused to vary greatly without making the thin-film dielectric layer 203 smaller in thickness. However, the capacitance of the capacitor is proportional to the area of the dielectric substance, and yet is inversely proportional to the thickness thereof. Therefore, in a case where the thin-film dielectric layer 203 is designed to have a small thickness, the lowering of the capacitance cannot be achieved without reducing the mutually facing areas of the first electrode layer 202 and the second electrode layer 204. This makes the manufacturing process difficult.

As further another problem, in the case of using the thin-film capacitor 200 as a high-frequency electronic component, both a direct current bias voltage for bringing about capacitive variation and a high-frequency signal voltage (high-frequency voltage) are applied to the thin-film capacitor 200 at the same time. In this case, however, when a high-frequency voltage of unduly high level is applied, the capacitance of the thin-film capacitor 200 is caused to vary not only with the application of the direct current bias voltage but also with the application of the high-frequency voltage. This is liable to result in occurrence of distortion such as waveform distortion or intermodulation distortion in the high-frequency electronic component. The waveform or intermodulation distortion cannot be minimized without decreasing the high-frequency voltage-induced capacitive variation by lowering the intensity of the high-frequency electric field. In order to decrease the capacitive variation, it is effective to make the thin-film dielectric layer 203 larger in thickness. However, as the thickness of the thin-film dielectric layer 203 is increased, the direct current electric field intensity is decreased correspondingly, which results in an undesirable decrease in the degree of the capacitive variation for which the direct current bias voltage is responsible.

A problem also exists in power handling capability. Since an electric current is allowed to pass through the capacitor easily in a high-frequency region, it follows that heat is generated in the capacitor due to the loss resistance that the capacitor sustains when operated in a high-frequency region. This gives rise to the risk of capacitor breakdown. In order to overcome such a problem associated with power handling capability, it is also effective to increase the thickness of the thin-film dielectric layer 203 so as to reduce the extent of heat generation per unit volume. However, as described above, as the thickness of the thin-film dielectric layer 203 is increased, the direct current electric field intensity is decreased correspondingly, which results in an undesirable decrease in the degree of capacitive variation for which the direct current bias voltage is responsible.

As further another problem, in the thin-film capacitor 200, in general, interfacial condition between the thin-film dielectric layer 203 and the first electrode layer 202 differs from that between the thin-film dielectric layer 203 and the second electrode layer 204. Therefore, in the case of applying a direct current bias voltage, there could be variation in leakage current characteristic depending upon the polarity of the direct current bias voltage applied. Such a variation has been well known as a so-called Schottky emission current phenomenon. More specifically, in a case where the first electrode layer 202 and the second electrode layer 204 are made of different materials, the work function of the first electrode layer 202 with respect to the thin-film dielectric layer 203 differs from that of the second electrode layer 204 with respect to the thin-film dielectric layer 203. In this case, when a leakage current is generated through the emission of electrons, the magnitude of the leakage current differs depending upon whether the electrons are emitted from the first electrode layer 202 or emitted from the second electrode layer 204. That is, the leakage current varies according to the polarity of the direct current bias voltage applied. On the other hand, even if the first electrode layer 202 and the second electrode layer 204 are made of the same material, interfacial condition between the first electrode layer 202 and the thin-film dielectric layer 203 formed thereon microscopically differs from that between the thin-film dielectric layer 203 and the second electrode layer 204 formed thereon, in consequence whereof there results a difference in work function. Also in this case, the leakage current varies according to the polarity of the direct current bias voltage applied. Accordingly, in order for the thin-film capacitor 200 to operate properly, it is necessary to take into account the polarity of the direct current bias voltage applied not only in a designing stage but also in a mounting stage.

SUMMARY OF THE INVENTION

The invention has been devised in view of the above-described problems with the conventional art, and accordingly its object is to provide a variable capacitor that succeeds in eliminating the need to provide an external bias supply circuit independently of the variable capacitor and is easy to handle.

Another object of the invention is to provide a variable capacitor that is producible with high manufacturability even if a low-capacitance characteristic is demanded of the variable capacitor.

Still another object of the invention is to provide a variable capacitor that has the advantages of suppressing undesirable capacitive variation caused by a high-frequency signal; minimizing intermodulation distortion; offering sufficiently power handling capability; and allowing great capacitive variation through impression of a direct current bias.

Further object of the invention is to provide a variable capacitor that succeeds in minimizing variation in capacitance characteristic that occurs depending upon the polarity of a direct current bias voltage and is thus readily mountable without the necessity of taking into account the polarity of the direct current bias voltage applied.

Further another object of the invention is to provide a circuit module and a communications apparatus that employ the variable capacitor as set forth hereinabove.

The invention provides a variable capacitor comprising:
a supporting substrate;
a variable capacitance element array composed of a plurality of variable capacitance elements which are formed on the supporting substrate, each of the variable capacitance elements being composed of a first electrode layer and a second electrode layer facing each other, and a dielectric layer sandwiched therebetween whose dielectric constant is changed through application of a direct current bias voltage, the variable capacitance elements being electrically connected in series in such a manner that in each of pairs of the variable capacitance elements adjacent to each other, the first electrode layer of a first variable capacitance element of the pair and the second electrode layer of a second variable capacitance element of the pair are connected; and
bias lines each connected to the variable capacitance elements, each of which includes at least one of resistance component and inductor component for applying the direct current bias voltage.

According to the variable capacitor of the invention as set forth, the direct current bias voltage is applied through the bias line to each of the variable capacitance elements individually. It will thus be seen that the variable capacitance elements are connected in parallel with one another regarding a direct current in the variable capacitor. This makes it possible to make the most of the rate of change in capacitance in the individual variable capacitance elements induced by a bias signal. Meanwhile, since the bias line includes at least one of a resistance component and an inductor component, it follows that no high-frequency signal is allowed to pass through the bias line. It will thus be seen that the variable capacitance elements are connected in series with one another regarding a high frequency in the variable capacitor. Hence, at the time of applying a high-frequency voltage, voltage division takes place so that the high-frequency voltage is divided among the variable capacitance elements. This makes it possible to suppress capacitive variation ascribable to a high-frequency signal, and thus prevent occurrence of distortion such as waveform distortion or intermodulation distortion effectively. Moreover, power handling capability can be enhanced.

As another feature, the variable capacitance elements are connected in series with one another. In this case, in contrast to the case of achieving capacitance formation in one predetermined region of a single variable capacitance element, it is possible to increase the areas of the first and second electrode layers. In the end, even if a low-capacitance characteristic is sought after, the variable capacitor is producible in a simple process with high processing accuracy and high manufacturability, and a desired capacitance value can be attained with excellent reproducibility.

As still another feature, in the variable capacitance elements which are adjacent to each other, the first electrode layer of the first variable capacitance element and the second electrode layer of the second variable capacitance element are electrically connected with each other. This means that, in the adjacent variable capacitance elements, their electrode layers for causing the ejection of electrons in the dielectric layer in accompaniment with the application of the direct current bias voltage through the bias lines are arranged in an alternating manner vertical-wise. In this case, even if there is a difference in work function between given layers due to the difference in material between the first electrode layer and the second electrode layer and to the difference in interfacial condition between the dielectric layer-first electrode layer interface and the dielectric layer-second electrode layer interface, in a case where the variable capacitance elements are provided in an even number, it follows that the variation in leakage current characteristic in the individual variable capacitance elements is cancelled out between one pair of the variable capacitance elements and the other pair of the variable capacitance elements. As a result, even if the polarity of the direct current bias voltage is reversed, the leakage current characteristic of the variable capacitor will be unaffected and thus remain substantially invariant, so long as an even number of the variable capacitance elements are provided for constituting the variable capacitor. On the other hand, in a case where the variable capacitance elements are provided in an odd number, one of them is not involved in the aforementioned cancellation. However, considering the fact that the leakage current of the one variable capacitance element accounts for approximately 1/(the number of the variable capacitance elements) of an entirety of the leakage current of the variable capacitor, it will be apparent that, also in this case, even if the polarity of the direct current bias voltage is reversed, the variation in leakage current characteristic can be reduced significantly. Hence, the variable capacitor of the invention is readily mountable without the necessity of taking into account the polarity of the direct current bias voltage applied.

In general, in a case where the bias line includes a resistance component, at the time of applying the direct current bias voltage to the variable capacitor, voltage division takes place so that the direct current bias voltage is divided among the dielectric layer and the bias line on the basis of the ratio between the resistance of the dielectric layer of the variable capacitance element and the resistance component of the bias line. Thus, in a case where variation in leakage current characteristic occurs in the individual variable capacitance elements depending upon the polarity of the direct current bias voltage, the direct current bias voltage applied to the dielectric layer of the variable capacitance element varies according to its polarity. The voltage division exerts a significant influence particularly when the dielectric layer exhibits low resistance, whereas the bias line exhibits extremely high resistance. As a result, even if the direct current bias voltages to be applied have a common absolute value, at the time of the application, the capacitance values of the variable capacitance elements are affected by the variation of the leakage current characteristics and are thus caused to vary depending upon the polarity of the direct current bias voltage. By way of contrast, according to the variable capacitor of the invention as set forth, as described previously, the variation in leakage current characteristic in the individual variable capacitance elements can be reduced significantly in an entirety of the variable capacitor. Therefore, in a case where the variable capacitance elements are provided in an even number, the variation in capacitance characteristic in the individual variable capacitance elements that occurs depending upon the polarity of the direct current bias voltage can be cancelled out in the entirety of the variable capacitor. Moreover, even in a case where the variable capacitance elements are provided in an odd number, the variation originating in a single variable capacitance element is so slight that the variation in capacitance characteristic in the entirety of the variable capacitor can be kept at a minimum. Accordingly, the variable capacitor of the invention can be operated with facility without the necessity of taking into account the polarity of the direct current bias voltage applied.

In the invention, it is preferable that the variable capacitor further comprises:

a first signal terminal adapted to be connected with a first end of the variable capacitance element array;

a second signal terminal adapted to be connected with a second end of the variable capacitance element array; and a direct current regulating capacitance element disposed between the first end of the variable capacitance element array and the first signal terminal, and/or between the second end of the variable capacitance element array and the second signal terminal.

According to the invention, the direct current regulating capacitance element is additionally disposed in the variable capacitor of the invention. This eliminates the need to prepare independently the direct current regulating capacitance element that is mounted, as has been conventional, on an external wiring board on which the variable capacitor is mounted. Accordingly, the circuit board on which the variable capacitor is mounted can be down-sized, and simultaneously the handleability can be enhanced.

In the invention, it is preferable that the direct current regulating capacitance element is formed immediately below the first and/or the second signal terminal.

According to the invention, when the direct current regulating capacitance element is formed immediately below the signal terminal, an area on the variable capacity capacitor in a plane shape for forming the direct current regulating capacitance element is no more necessary. This makes it possible to achieve miniaturization of the variable capacitor and simultaneously, further miniaturization of a wiring board on which the variable capacitor is mounted so that the handleability can be enhanced.

In the invention, it is preferable that a number of the variable capacitance elements is $2n+1$ (where n represents a natural number), and that, of all the variable capacitance elements, the one/ones in number of $2i-1$ (where i represents a natural number equal to or smaller than n) is/are larger in capacitance value than the other variable capacitance elements at equal direct current bias voltages.

According to the invention, in a case where 2n+1 (where n represents a natural number) pieces of the variable capacitance elements are connected in series with one another, the capacitance value of the variable capacitor is substantially equal to the sum total of the capacitance values of an even number of the series-connected variable capacitance elements, excluding the one/ones in number of 2i−1 (where i represents a natural number equal to or smaller than n) That is, the capacitance of 2i−1 number of the variable capacitance element/elements does not contribute essentially to the capacitance value of an entirety of the variable capacitor. In light of this, even if the variable capacitor is composed of an odd number of the variable capacitance elements, the variation in capacitance characteristic originating in a single variable capacitance element as described previously, which occurs depending upon the polarity of the direct current bias voltage, is so slight that no serious problem arises in the entirety of the variable capacitor. It is thus possible to achieve substantially the same effect as achieved in the case of composing the variable capacitor by the use of an even number of the variable capacitance elements. As a result, the variation in capacitance characteristic in the individual variable capacitance elements that occurs depending upon the polarity of the direct current bias voltage can be suppressed in the entirety of the variable capacitor.

In the invention, it is preferable that the variable capacitor further comprises:

a first signal terminal adapted to be connected with a first end of the variable capacitance element array; and a second signal terminal adapted to be connected with a second end of the variable capacitance element array, and wherein the bias lines are composed of first and second bias lines through which the individual first electrode layers are connected to the first and the second signal terminals in an alternating manner.

According to the invention, in the variable capacitance element array, the first end and the second end are connected to the first signal terminal and the second signal terminal, respectively. Moreover, the bias lines are composed of the first bias line and the second bias line through which the individual first electrode layers are connected to the first and the second signal terminals in an alternating manner. This construction enables the shared use of a single terminal between a bias terminal for applying a direct current bias voltage and a high-frequency signal terminal. It is thus unnecessary to prepare an additional bias terminal independently, wherefore the variable capacitor can be made simple in structure and small in size.

In the invention, it is preferable that the dielectric layer is made of barium strontium titanate.

According to the invention, by using barium strontium titanate to form the dielectric layer, not only it is possible to reduce dielectric loss, but it is also possible to increase the rate of change in capacitance.

The invention provides a circuit module comprising the variable capacitor employed as a capacitor required for constituting a resonant circuit.

According to the invention, in the circuit module, the variable capacitor mentioned above is employed as a capacitor required for constituting a resonant circuit. In this construction, the rate of change in capacitance in the capacitor is sufficiently high, and the predetermined capacitance can be obtained with high accuracy. This makes it possible to obtain a desired resonant frequency in a wider frequency range with high accuracy. Moreover, by virtue of power handling capability and independence from the polarity of a direct current bias voltage of the capacitor for constituting a resonant circuit, the circuit module is excellent in reliability, easiness of manufacturing, and productivity.

The invention provides a communications apparatus comprising the circuit module of the invention employed as filter means.

According to the invention, in the communications apparatus, the circuit module of the invention is employed as filter means. This makes it possible to determine the resonant frequency in a wider frequency range with high accuracy, and thereby allow the filter means to function in a wider range of frequencies in a desired manner with high accuracy.

BRIEF DESCRIPTION OF THE DRAWINGS

Other and further objects, features, and advantages of the invention will be more explicit from the following detailed description taken with reference to the drawings wherein.

DETAILED DESCRIPTION OF THE PREFERRED EMBODIMENTS

Figure 1:
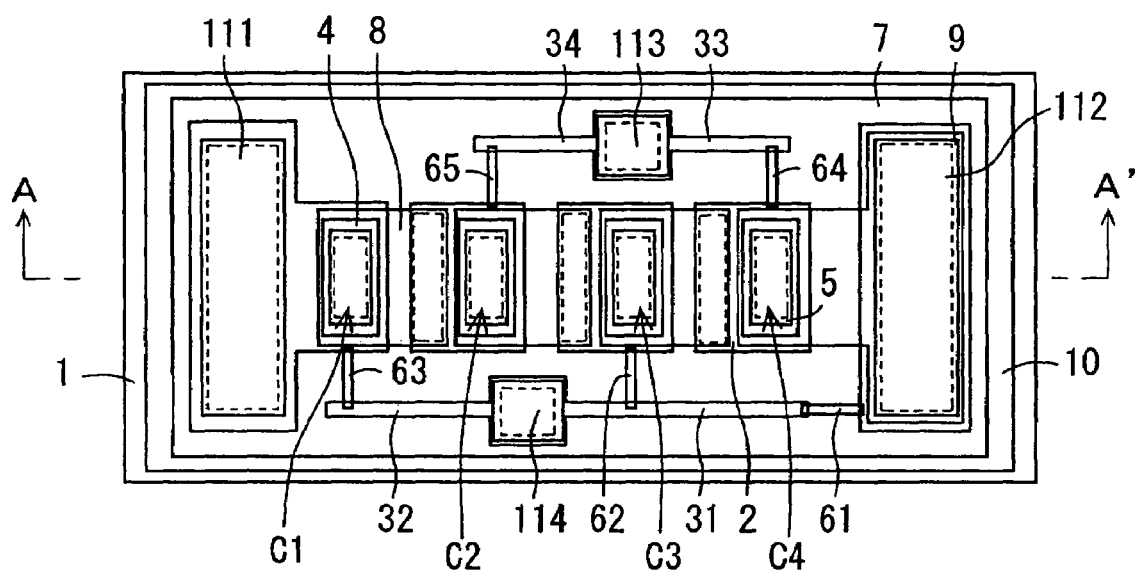
FIG. 1 is a transparent plan view showing a variable capacitor according to a first embodiment of the invention.

Now referring to the drawings, preferred embodiments of the invention are described below.

Figure 2:
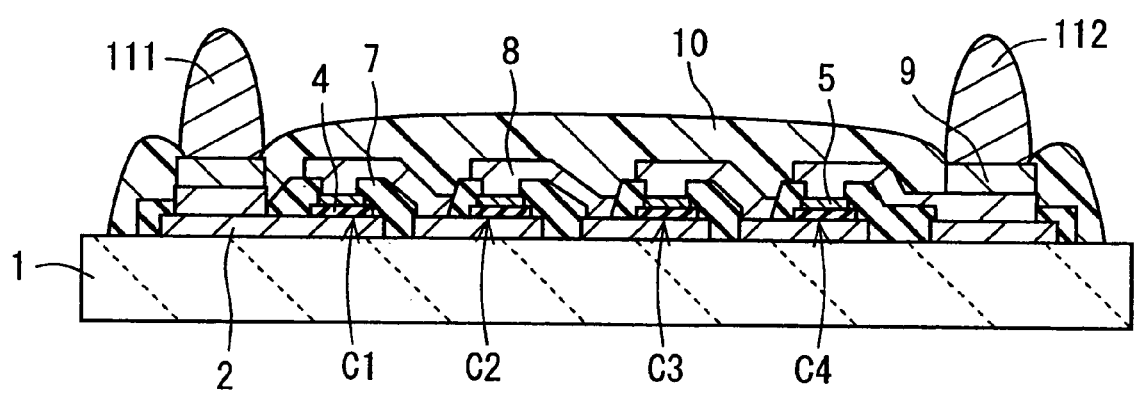
FIG. 2 is a sectional view of the variable capacitor taken along the line A-A' of FIG. 1.

Hereinafter, a variable capacitor of the invention will be described in detail with reference to the accompanying drawings. FIGS. 1 and 2 show a variable capacitor according to a first embodiment of the invention. The variable capacitor includes four pieces of variable capacitance elements that are connected in series with one another. FIG. 1 is a transparent plan view showing the variable capacitor, and FIG. 2 is a sectional view of the variable capacitor taken along the line A-A' of FIG. 1.

In FIGS. 1 and 2, the variable capacitor comprises a supporting substrate 1; a first electrode layer 2; a dielectric layer 4; a second electrode layer 5; conductor lines 31, 32, 33 and 34; thin-film resistors 61, 62, 63, 64, and 65; an insulating layer 7; an extraction electrode layer 8; a solder diffusion preventive layer 9; a passivation layer 10; and solder terminal portions 111, 112, 113, and 114. In the variable capacitance elements which are adjacent to one another, the first electrode layer 2 of a first variable capacitance element and the second electrode layer 5 of a second variable capacitance element are electrically connected to each other by way of the extraction electrode layer 8. To be more specific, the variable capacitor comprises a supporting substrate 1, a variable capacitance element array, a first bias line, and a second bias line. The variable capacitance element array is formed on the supporting substrate 1. The variable capacitance element array is composed of a plurality of variable capacitance elements C1 through C4 which are electrically connected in series with one another. The variable capacitance elements C1 through C4 each comprise the first electrode layer 2 and the second electrode layer 5 which are disposed so as to face each other; and the dielectric layer 4 sandwiched between the first electrode layer 2 and the second electrode layer 5, whose dielectric constant is changed through application of direct current bias voltage. The variable capacitance element array has such a constitution that, in the adjacent variable capacitance elements, the first electrode layer 2 of the first variable capacitance element and the second electrode layer 5 of the second variable capacitance element are electrically connected in series with each other. The variable capacitance elements C1 through C4 are each connected to the first bias line and the second bias line which include at least one of a resistance component and an inductor component for applying the direct current bias voltage.

The solder terminal portions 111 and 112 constitute signal terminals in conjunction with the solder diffusion preventive layer 9. On the other hand, the solder terminal portions 113 and 114 constitute bias terminals in conjunction with the solder diffusion preventive layer 9. Hereafter, one signal terminal composed of the solder terminal portion 111 and the solder diffusion preventive layer 9 will be referred to as "first signal terminal", whereas the other signal terminal composed of the solder terminal portion 112 and the solder diffusion preventive layer 9 will be referred to as "second signal terminal". Likewise, one bias terminal composed of the solder terminal portion 114 and the solder diffusion preventive layer 9 will be referred to as "first bias terminal", whereas the other bias terminal composed of the solder terminal portion 113 and the solder diffusion preventive layer 9 will be referred to as "second bias terminal". Moreover, in FIGS. 1 and 2, reference symbols C1, C2, C3 and C4 each represent a variable capacitance element composed of the lower-laid first electrode layer 2, the upper-laid second electrode layer 5 which electrode layers are disposed so as to face each other, and the dielectric layer 4 sandwiched therebetween. The capacitance of the variable capacitance element is caused to vary in accompaniment with application of a direct current bias voltage to be applied.

In addition, in the embodiment shown in FIG. 1, one bias line composed of the conductor lines 31 and 32 to which the thin-film resistors 61, 62, and 63 are connected as resistance components will be referred to as "first bias line", whereas the other bias line composed of the conductor lines 33 and 34 to which the thin-film resistors 64 and 65 are connected as resistance components will be referred to as "second bias line".

The supporting substrate 1 is constituted by the use of a ceramic substrate made of alumina or the like material, or a single-crystalline substrate made of sapphire or the like material. On the supporting substrate 1, the first electrode layer 2, the dielectric layer 4, and the second electrode layer 5 are formed one after another over substantially the entire surface thereof. Upon the completion of the layer deposition, the second electrode layer 5, the dielectric layer 4, and the first electrode layer 2 are successively processed by etching into their respective predetermined shapes.

In forming the first electrode layer 2, the dielectric layer 4, and the second electrode layer 5 by deposition, there is a possibility that impurities such as particles find their way into a gap between the first electrode layer 2 and the dielectric layer 4, and a gap between the dielectric layer 4 and the second electrode layer 5 as well. Considering that the intrusion of impurities could lead up to degradation in the characteristics of the variable capacitor, the presence of impurities should be kept at a minimum. Accordingly, the first electrode layer 2, the dielectric layer 4, and the second electrode layer 5 should preferably be formed continuously in a common deposition apparatus, with its deposition chamber kept closed to atmosphere, by using a known deposition method, in particular, the sputtering process is desirable.

It is necessary to perform high-temperature sputtering for forming the dielectric layer 4. Therefore, the first electrode layer 2 must be made of a material having a high melting point so as to withstand a high-temperature condition. To be specific, a metal material such as Pt or Pd is suitable for use. Moreover, upon the completion of the formation process by high-temperature sputtering, the first electrode layer 2 is heated to a temperature as high as 700 to 900° C., which is equal to the temperature at which the dielectric layer 4 is subjected to sputtering, and is then left standing for a predetermined period of time until sputtering is started for the dielectric layer 4. As a result, the first electrode layer 2 is leveled off successfully.

With consideration given to the resistance component and continuity of the first electrode layer 2 in itself, the first electrode layer 2 is preferably designed to have a large thickness. However, with consideration given to the adherability between the first electrode layer 2 and the supporting substrate 1, the first electrode layer 2 is preferably designed to have a relatively small thickness. In conclusion, the thickness of the first electrode layer 2 is so determined as to reach an excellent compromise between the two contradictory grounds. To be specific, the thickness falls in a range of from 0.1 to 10 μm. If the thickness of the first electrode layer 2 is less than 0.1 μm, probably, the resistance of the first electrode layer 2 in itself is increased, and also it is impossible to ensure satisfactory continuity in the first electrode layer 2. By way of contrast, if the thickness is greater than 10 μm, the internal stress of the first electrode layer 2 becomes so large that, probably, the adherability with the supporting substrate 1 is decreased, and the supporting substrate 1 suffers from warping.

The dielectric layer 4 is preferably designed to exhibit a high dielectric constant by the use of perovskite-type oxide crystal grains which contain at least Ba, Sr, and Ti. By using barium strontium titanate in particular, it is possible to realize the dielectric layer 4 which is low in dielectric loss and yet high in the rate of change in capacitance. For example, the dielectric layer 4 is formed on a surface (top surface) of the first electrode layer 2 as follows. In a deposition process, sputtering is performed with use of, as a target, a dielectric substance from which perovskite-type oxide crystal grains are obtained. The deposition is performed for a time period determined by taking the desired thickness into consideration. At this time, by performing high-temperature sputtering with the substrate temperature set at as high as 800° C. for example, it is possible to eliminates the need to carry out a heat treatment subsequent to the sputtering process. In this way, the dielectric layer 4 is formed that is low in loss and yet high in dielectric constant and in the rate of change in capacitance.

As the material of the second electrode layer 5, Au with a small resistivity is desirable from the standpoint of decreasing the resistance of the second electrode layer 5. However, in order to enhance the adherability with the dielectric layer 4, it is preferable that the second electrode layer 5 is made of Pt, or that an adherent layer is created by the use of Pt or the like material. The thickness of the second electrode layer 5 is set to fall in a range of from 0.1 to 10 μm. The lower limit of the thickness is, just as is the case with the first electrode layer 2, determined in consideration of the resistance and continuity of the second electrode layer 5 in itself. On the other hand, the upper limit of the thickness is determined in consideration of the adherability with the dielectric layer 4. Preferably, the thickness of the second electrode layer 5 is set to be equal to or smaller than that of the dielectric layer 4. By doing so, in a subsequent etching process, the second electrode layer 5 can be processed with little influence on the dielectric layer 4. This makes it possible to achieve etching with enhanced patterning accuracy, and thereby attain a desired capacitance value with high accuracy.

After the deposition process is performed in the manner thus far described, the second electrode layer 5, the dielectric layer 4, and the first electrode layer 2 are successively processed by etching into their respective predetermined shapes. In the etching process, a resist is coated uniformly over the entire layer surface by a spin coating or the like technique, and, after the resist is patterned into a predetermined shape by the photolithography method, wet etching or dry etching is performed to obtain the desired shape. Considering the fact that the capacitance values of the variable capacitance elements C1 through C4 depend on the area of the second electrode layer 5, it is desirable to adopt dry etching for etching the second electrode layer 5 from an accuracy standpoint.

The dry etching process can be implemented with use of an electron cyclotron resonance (ECR) apparatus. In this case, argon plasma is used as an etchant.

Note that the dielectric layer 4 may be etched either by wet etching or dry etching.

Likewise, the first electrode layer 2 may be etched either by wet etching or dry etching. However, in a case where the thickness thereof is somewhat large, just as is the case with the second electrode layer 5, it is desirable to adopt dry etching from a patterning accuracy standpoint.

The second electrode layer 5, the dielectric layer 4, and the first electrode layer 2 are etched in such a way that an area of the lower surface of the dielectric layer 4 is smaller than an area of the upper surface of the first electrode layer 2, and an area of the lower surface of the second electrode layer 5 is smaller than an area of the upper surface of the dielectric layer 4. In other words, the etching is carried out so that the area of the surface of the dielectric layer 4, facing the first electrode layer 2, is smaller than the area of the surface of the first electrode layer 2, facing the dielectric layer 4 while the area of the surface of the second electrode layer 5, facing the dielectric layer 4, is smaller than the surface of the dielectric layer 4, facing the second electrode layer 5. As a consequence, the first electrode layer 2 is free of the dielectric layer 4 at its outer edge onto which an electric field tends to concentrate, wherefore the leakage current characteristic can be improved.

In the above stated manner, the variable capacitance elements C1 through C4 are fabricated. Besides, in order to establish electrical connection between the first signal terminal and the variable capacitance element C1, and between the variable capacitance element C4 and the second signal terminal as well, it is preferable to dispose an electrical conductive layer made of a material possessing electrical conductivity in the predetermined locations on the supporting substrate 1 where the first and second signal terminals are formed. The electrical conductive layer may be formed separately by deposition after the fabrication of the variable capacitance elements C1 through C4, or may be formed concurrently with a patterning process for the first electrode layer 2 with use of the same materials as those used for the first electrode layer 2. In the latter case, the electrical conductive layer and the first electrode layer 2 can be formed in a single step.

The first bias line is composed of the conductor lines 31 and 32 and the thin-film resistors 61, 62 and 63. The first bias line is disposed in such a way as to provide connection between the first bias terminal and the first electrode layer 2 of the first variable capacitance element C1; between the first bias terminal and the first electrode layer 2 of the third variable capacitance element C3; and between the first bias terminal and the second electrode layer 5 of the fourth variable capacitance element C4, namely between the first bias terminal and the electrical conductive layer formed at the second signal terminal-placement position that is electrically connected to the second electrode layer 5 of the fourth variable capacitance element C4 through the extraction electrode layer 8. The first bias line is connected via the first bias terminal to an external circuit.

The second bias line is composed of the conductor lines 33 and 34 and the thin-film resistors 64 and 65. The second bias line is disposed in such a way as to provide connection between the second bias terminal and the first electrode layer 2 of the second variable capacitance element C2 and between the second bias terminal and the first electrode layer 2 of the fourth variable capacitance element C4. The second bias line is connected via the second bias terminal to an external circuit.

In this construction, the variable capacitance elements C1 through C4 are connected in parallel with one another by way of the first and second bias lines.

The conductor lines 31, 32, 33 and 34 may be formed separately by deposition after processing the first electrode layer 2, the dielectric layer 4, and the second electrode layer 5 into their respective predetermined shapes. In this case, to protect the first electrode layer 2, the dielectric layer 4, and the second electrode layer 5 in finished form from damage, the conductor lines 31, 32, 33 and 34 are preferably formed by the lift off method.

Otherwise, the conductor lines 31, 32, 33 and 34 may be formed concurrently with a patterning process for the first electrode layer 2 with use of the same materials as those used for the first electrode layer 2. In this case, the conductor lines 31, 32, 33 and 34 and the first electrode layer 2 can be obtained in a single step.

In this construction, the conductor lines 31 and 32 are electrically connected to each other at the first bias terminal-placement position, whereas the conductor lines 33 and 34 are electrically connected to each other at the second bias terminal-placement position. In order to establish such an electrical connection, it is preferable to dispose an electrical conductive layer made of a material possessing electrical conductivity in the predetermined locations on the supporting substrate 1 where the first and second signal terminals are formed. The electrical conductive layer may be formed separately by deposition after the fabrication of the variable capacitance elements C1 through C4. Alternatively, the electrical conductive layer may be formed concurrently with a patterning process for the conductor lines 31 through 34 with use of the same materials as those used for the conductor lines 31 through 34. Note that, in the aforementioned patterning process, that portion of the conductor line 31, 32 which is located at the first bias terminal-placement position and that portion of the conductor line 33, 34 which is located at the second bias terminal-placement position are shaped in conformity with the configuration of the first bias terminal and the configuration of the second bias terminal, respectively. In this case, the electrical conductive layer and the conductor lines 31 through 34 can be obtained in a single step.

It is preferable that the first and second bias terminals are arranged in point-symmetrical relationship with respect to the centerline of the variable capacitor of the invention. In this case, even if the variable capacitor is turned upside down with respect to the original arrangement as shown in the plan view of FIG. 1, it can be mounted on a wiring board without any problem. This leads to handleability enhancement.

In order to form the thin-film resistors 61 through 65 for constituting the first and second bias lines, it is desirable to use a material which exhibits a specific resistance of 1 Ωcm or above. By the use of such a high-resistance material, it is possible to reduce the size of the thin-film resistors 61 through 65 having desired resistance, and thereby achieve miniaturization and high integration as well. The specific examples of materials suitable for use in forming the thin-film resistors 61 through 65 include tantalum nitride, TaSiN, and Ta—Si—O. For example, in the case of selecting tantalum nitride, according to the reactive sputtering method, sputtering is performed with use of Ta (tantalum) as a target in an atmosphere added with nitrogen gas. In this way, the thin-film resistors 61 through 65 having desired composition ratio and resistivity can be obtained.

By setting the sputtering conditions appropriately, it is possible to obtain a film having a specific resistance of 1 Ωcm or above. Upon the completion of the sputtering process, an etching process such as reactive ion etching (RIE) is carried out with use of a resist coating processed into a predetermined shape as a mask, thereby achieving patterning with facility.

The resistance values of the first and second bias lines are determined in such a way that the impedance of the first and second bias lines is larger than the impedance of each of the variable capacitance elements C1 through C4 in a used frequency region. Since the conductor lines 31 through 34 are far smaller in resistance than the thin-film resistors 61 through 65, it follows that the first and second bias lines are substantially equal in resistance to the thin-film resistors 61 through 65. Accordingly, the resistance values of the thin-film resistors 61 through 65 are adjusted to be larger than the impedance of each of the variable capacitance elements C1 through C4 in a used frequency region. For example, assuming that the variable capacitor is operated at a frequency of 1 GHz and the variable capacitance elements C1 through C4 have a capacitance of 4 pF. In this case, on the basis of a frequency equal to 1/10 of the frequency (100 MHz), the resistance values of the thin-film resistors 61 through 65 are adjusted to be ten times or more larger than the impedance of the variable capacitance elements C1 through C4 at 100 MHz in a manner which does not affect the impedance. Then, in the thin-film resistors 61 through 65, a resistance value of approximately 4 kΩ or above is necessary. Meanwhile, for example, by forming the thin-film resistors 61 through 65, using the above-described material having a specific resistance of 1 Ωcm, in such a way that the film thickness is 50 nm and the aspect ratio (length/width) is 50, it is possible to obtain a resistance value of 10 kΩ. In this way, the thin-film resistors 61 through 65 having a resistance value of 4 kΩ or above can be realized easily, with the size thereof kept small.

The first and second bias lines including the thin-film resistors 61 through 65 are formed directly on the supporting substrate 1. This eliminates the need to prepare an insulating layer for ensuring insulation between the first and second electrode layers 2 and 5 and the extraction electrode layer 8, which will be required in the case of forming the bias lines over the variable capacitance elements C1 through C4. As a consequence, an entirety of the variable capacitor can be simplified in configuration. Moreover, in a case where the first and second bias lines are disposed within the variable capacitor, there is no need to form an external bias supply circuit on a wiring board on which the variable capacitor is mounted. This makes it possible to reduce the size of the circuitry and simultaneously enhance the handleability.

In the embodiment shown in FIG. 1, each of the thin-film resistors 61 through 65 has its first end joined to the corresponding one of the first electrode layers 2 of the variable capacitance elements C1 through C4 and the electrical conductive layer formed at the second signal terminal-placement position, and has its second end joined to the corresponding one of the conductor lines 31 through 34. Alternatively, each of the thin-film resistors 61 through 65 can be arranged partway of the corresponding one of the conductor lines 31 through 34 for providing connection between the first electrode layers 2 of the variable capacitance elements C1 through C4 as well as the electrical conductive layer formed at the second signal terminal-placement position and the first and second bias terminals.

For the next step, the insulating layer 7 is formed to ensure insulation between the extraction electrode layer 8 formed on the second electrode layer 5 and the first electrode layer 2 in one and the same variable capacitance element. Moreover, the insulating layer 7 is so formed as to cover the dielectric layer 4, thereby improving the moisture resistance of the variable capacitor.

The insulating layer 7 is processed into a predetermined shape by the dry etching or the like method with use of an ordinary resist. As are indicated by the dotted lines in FIG. 1, in the insulating layer 7 are formed a through hole for providing connection between the first signal terminal and the first electrode layer 2 of the variable capacitance element C1; a through hole for providing connection between the second electrode layer 5 and the extraction electrode layer 8; a through hole for providing connection between the extraction electrode layer 8 and the first electrode layer 2 in the adjacent variable capacitance elements; and a through hole for providing connection between the extraction electrode layer 8 and the second signal terminal.

For example, the insulating layer 7 may be made of silicon dioxide or silicon nitride to attain excellent moisture resistance. With consideration given to coatability, the insulating layer 7 should preferably be formed by the chemical vapor deposition (CVD) or the like method.

Then, the extraction electrode layer 8 is formed so as to establish, through the through holes formed in the insulating layer 7, electrical connection between the second electrode layer 5 of the variable capacitance element C1 and the first electrode layer 2 of the variable capacitance element C2; between the second electrode layer 5 of the variable capacitance element C2 and the first electrode layer 2 of the variable capacitance element C3; between the second electrode layer 5 of the variable capacitance element C3 and the first electrode layer 2 of the variable capacitance element C4; and between the second electrode layer 5 of the variable capacitance element C4 and the electrical conductive layer formed at the second signal terminal-placement position.

Here, the first electrode layer 2 of the variable capacitance element C1 is electrically connected to the first signal terminal, whereupon the variable capacitance elements C1 through C4 are connected in series with one another across the first signal terminal and the second signal terminal. In order to establish electrical connection between the first electrode layer 2 of the variable capacitance element C1 and the first signal terminal, for example, the first electrode layer 2 of the variable capacitance element C1 is electrically connected to the electrical conductive layer formed at the first signal terminal-placement position, or alternatively the first electrode layer 2 of the variable capacitance element C1 is formed continuously so as to extend to the first signal terminal-placement position, so that the first signal terminal and the variable capacitance element C1 hold the first electrode layer 2 in common.

As the material of the extraction electrode layer 8, it is desirable to use a low-resistance metal material such as Au or Cu. Moreover, with consideration given to the adherability between the extraction electrode layer 8 and the insulating layer 7, it is possible to form an adherent layer made of Ti, Ni, or the like material.

In forming the extraction electrode layer 8, it is preferable to provide, in the locations where the first and second signal terminals and the first and second bias terminals are formed, a layer made of the material of the extraction electrode layer 8. In this case, the regions where the first and second signal terminals and the first and second bias terminals are formed are made uniform in level, thereby facilitating a mounting process.

Next, the solder diffusion preventive layer 9 is formed. At the time of executing reflow for the formation of the solder terminal portions 111 through 114 and the mounting process, the solder diffusion preventive layer 9 prevents the solder constituting the solder terminal portions 111 through 114 from spreading toward the extraction electrode layer 8 or toward the first electrode layer 2. Ni is desirable as the material of the solder diffusion preventive layer 9. Moreover, in some cases, in order to gain enhanced solder wettability, the solder diffusion preventive layer 9 has its surface layer with an approximately 0.1 µm-thick coating of Au, Cu, or the like material that exhibits excellent solder wettability.

Subsequently, the passivation layer 10 is so formed as to cover substantially the entire surface of the construction, with the solder terminal portions 111 through 114 left exposed. The passivation layer 10 provides not only mechanical protection but also protection against chemical attack for the constituent components of the variable capacitor. In forming the passivation layer 10, it is important to ensure that the solder diffusion preventive layer 9 formed at the solder terminal portion 111 to 114 placement position is left exposed. The passivation layer 10 is preferably made of a material that exhibits both high heat resistance and excellent coatability to a difference in surface level. To be specific, a resin material such as polyimide resin or BCB (benzocyclobutene) resin is suitable for use. After a solution of the resin raw material is coated by the spin coating or the like method, the coating is cured at a predetermined temperature, whereupon the passivation layer 10 is obtained.

Lastly, the solder terminal portions 111, 112, 113 and 114 are each formed on the solder diffusion preventive layer 9. This helps facilitate the mounting of the variable capacitor on an external wiring board. In general, the solder terminal portions 111, 112, 113 and 114 are fabricated by printing a solder paste with use of a mask of predetermined configuration, followed by executing reflow.

In the variable capacitor of the invention thus constructed, the variable capacitance elements C1 through C4 are connected in series with one another across the first signal terminal and the second signal terminal that act as an input terminal and an output terminal, respectively. Moreover, the thin-film resistors 61 through 65 constituting the first and second bias lines assume impedance components that are far larger than the impedance of the variable capacitance elements C1 through C4. Therefore, it never occurs that high-frequency signals fed from the first and second signal terminals leak through the first and second bias lines. After all, in the variable capacitor of the invention, it is possible to accomplish serial connection of the variable capacitance elements C1 through C4 regarding a high frequency.

Hence, the first and second electrode layers 2 and 5 constituting the capacitance forming region in each of the variable capacitance elements C1 through C4 can be increased in area. This makes it possible to perform processing with high accuracy, as well as to achieve a desired capacitance value with high accuracy and excellent reproducibility.

At the time of applying a high-frequency voltage to the series-connected variable capacitance elements C1 through C4, voltage division takes place so that the high-frequency voltage is divided among the variable capacitance elements C1 through C4. As a result, the variable capacitance elements C1 through C4 are each given a decreased degree of the high-frequency voltage, wherefore capacitive variation ascribable to a high-frequency signal can be minimized successfully. This makes it possible to prevent occurrence of distortion such as waveform distortion or intermodulation distortion effectively, as well as to enhance power handling capability, in a high-frequency electronic component employing the variable capacitor.

A direct current bias voltage is applied to control the capacitance characteristics of the variable capacitance elements C1 through C4. In the variable capacitance elements C1 through C4 of the invention, the direct current bias voltage is applied from the first or second bias terminal, through the first and second bias lines to the variable capacitance elements C1 through C4. The variable capacitance elements C1 through C4 are able to exhibit a predetermined dielectric constant by adjusting the magnitude of a to-be-applied direct current bias voltage properly. As a result, the desired capacitance characteristics can be attained.

Since the variable capacitance elements C1 through C4 are connected in parallel with one another by way of the first and second bias lines, it follows that a direct current bias voltage can be supplied to the variable capacitance elements C1 through C4 on an individual basis with stability. The variable capacitor will thus be advantageous in easiness of capacitance-characteristic control.

Moreover, at the time of applying a high-frequency voltage to the variable capacitance elements C1 through C4, no high-frequency signal leaks through the first and second bias lines. Therefore, the direct current bias voltage can be applied to the variable capacitance elements C1 through C4 with higher stability. This makes it possible to make the most of the rate of change in capacitance in the variable capacitance elements C1 through C4 for which the direct current bias voltage is responsible.

The control of the capacitance characteristics of the variable capacitance elements C1 through C4 is exercised through application of a direct current bias voltage. Here, assuming that an externally-applied direct current bias voltage is Vo; the magnitude of the resistance component at the first and second bias lines is Rb; and the magnitude of the insulation resistance at the dielectric layer 4 of the variable capacitance elements C1 through C4 is Rc, then the magnitude of the direct current bias voltage to be actually applied to the variable capacitance elements C1 through C4 is given as: Vo×Rc/(Rb+Rc), as the result of the voltage division owing to the resistance component included in the first and second bias lines. The magnitude Rc of the insulation resistance at the variable capacitance elements C1 through C4 varies depending upon the magnitude of a leakage current. Therefore, if the polarity of a direct current bias voltage is reversed, the magnitude of the direct current bias voltage to be applied to the variable capacitance elements C1 through C4 will be changed correspondingly. As a result, when receiving external application of a direct current bias voltage of predetermined value, depending upon its polarity, the variable capacitance elements C1 through C4 could vary in capacitance characteristic.

In light of the foregoing, the variable capacitor of the invention is so designed that, in the adjacent variable capacitance elements, their electrode layers for causing the ejection of electrons in the dielectric layer 4 in accompaniment with the application of the direct current bias voltage to the variable capacitance elements C1 through C4 are arranged in an alternating manner vertical-wise. Looking at the variable capacitance elements C1 through C4 on an individual basis, it will be seen that a pair of the variable capacitance elements C1 and C3 and a pair of the variable capacitance elements C2 and C4 differ from each other in leakage current characteristic, and thus in resultant capacitance characteristic. However, since the variable capacitance elements are provided in an even number, it follows that the variation in capacitance characteristic can be cancelled out between the pair of the variable capacitance elements C1 and C3 and the pair of the variable capacitance elements C2 and C4. Hence, even if the polarity of the direct current bias voltage is reversed, the capacitance of the entirety of the variable capacitor will be unaffected and thus remain invariant. As a result, it is no longer necessary to take into account the polarity of a direct current bias voltage, wherefore the variable capacitor of the invention can be set up with facility.

Next, the variable capacitor according to a second embodiment of the invention will be described with reference to FIGS. 3 and 4.

Figure 3:
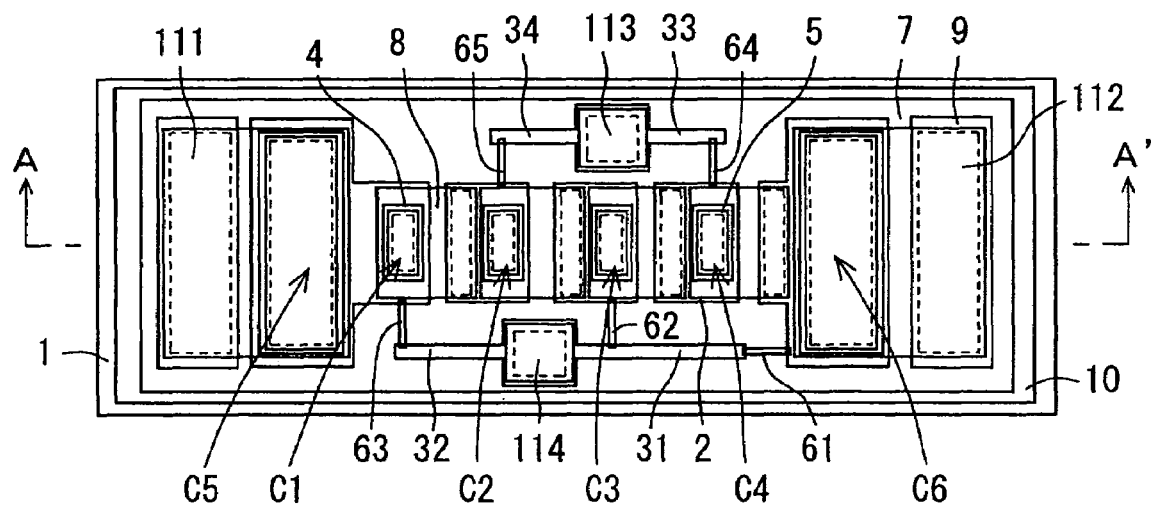
FIG. 3 is a transparent plan view showing a variable capacitor according to a second embodiment of the invention.
Figure 4:
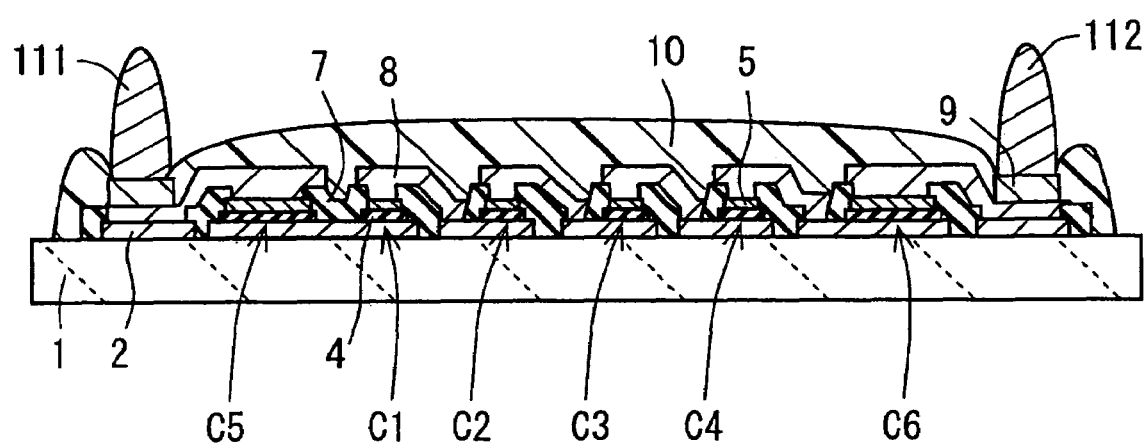
FIG. 4 is a sectional view of the variable capacitor taken along the line A-A' of FIG. 3.

These figures illustrate the variable capacitor having four pieces of series-connected variable capacitance elements, with FIG. 3 showing a transparent plan view and FIG. 4 showing a sectional view of the variable capacitor taken along the line A-A' of FIG. 3.

In FIGS. 3 and 4, the constituent components that play the same or corresponding roles as in FIGS. 1 and 2 will be identified with the same reference symbols, and overlapping descriptions will be omitted.

In FIGS. 3 and 4, the variable capacitor includes direct current regulating capacitance elements C5 and C6. The direct current regulating capacitance elements C5 and C6 are disposed to avoid that a direct current bias voltage exerts its influence both on the first signal terminal side and the second signal terminal side. The direct current regulating capacitance element C5 is interposed between the first signal terminal and the variable capacitance element C1, whereas the direct current regulating capacitance element C6 is interposed between the variable capacitance element C4 and the second signal terminal. The direct current regulating capacitance elements C5 and C6 may be formed concurrently with the fabrication of the variable capacitance elements C1 through C4 with use of the same materials as those used for the variable capacitance elements C1 through C4. Note that, at this time, the dielectric layer of the direct current regulating capacitance element may be made of a dielectric substance which is different from that used for the dielectric layer of the variable capacitance element, such as silicon oxide or silicon nitride.

The direct current regulating capacitance element C5 and the variable capacitance element C1 hold the first electrode layer 2 in common. The first electrode layer 2 of the direct current regulating capacitance elements C6 is electrically connected to the second electrode layer 5 of the variable capacitance element C4 by way of the extraction electrode layer 8. The direct current regulating capacitance elements C5 and C6 are, at their second electrode layers 5, electrically connected to the first signal terminal and the second signal terminal, respectively, by way of the extraction electrode layer 8. In this way, the first signal terminal, the direct current regulating capacitance element C5, the variable capacitance elements C1 through C4, the direct current regulating capacitance element C6, and the second signal terminal are connected in series with one another in the order of their arrangement as specified. Alternatively, the first electrode layer 2 of the direct current regulating capacitance element C5 may be continuously formed so as to extend to the first signal terminal-placement position, so that the first signal terminal and the direct current regulating capacitance element C5 hold the first electrode layer 2 in common. Then, the direct current regulating capacitance element C5 and the variable capacitance element C1 are connected to each other in a manner similar to that connecting the variable capacitance elements C1 through C4. Strictly speaking, the second electrode layer 5 of the direct current regulating capacitance element C5 and the first electrode layer 2 of the variable capacitance element C1 are electrically connected to each other by way of the extraction electrode layer 8. Also in this case, the first signal terminal, the direct current regulating capacitance element C5, the variable capacitance elements C1 through C4, the direct current regulating capacitance element C6, and the second signal terminal are connected in series with one another in the order of their arrangement as specified.

The capacitance of the direct current regulating capacitance element C5, C6 is set at as large a value as possible within the bounds of not affecting the capacitance value of the variable capacitor operating in a high-frequency band. This is achieved by, for example, making the direct current regulating capacitance element C5, C6 larger in formation area than the variable capacitance element C1 to C4. In this way, it is possible to attain substantially the same rate of change in capacitance as achieved in the variable capacitor having no direct current regulating capacitance elements C5 and C6.

In the direct current regulating capacitance elements C5 and C6, the dielectric layer 4 is made of the same material as that used in the variable capacitance elements C1 through C4. However, as described just above, the direct current regulating capacitance element C5, C6 has as large a capacitance value as possible within the bounds of not affecting the capacitance value of the variable capacitor operating in a high-frequency band. Therefore, even though the capacitance of the direct current regulating capacitance element C5, C6 is caused to vary, the variation exerts little influence on the capacitance value of the variable capacitor and on the rate of change in capacitance.

According to the second variable capacitor of the invention such as shown herein, by virtue of the direct current regulating capacitance elements C5 and C6, there is no need to dispose any direct current regulating capacitance element on the wiring board on which the variable capacitor is mounted. This makes it possible to achieve miniaturization of the circuitry and simultaneously enhance the handleability.

Next, the variable capacitor according to a third embodiment of the invention will be described with reference to FIGS. 5 and 6.

These figures illustrate the variable capacitor having five pieces (n=2) of series-connected variable capacitance elements. FIG. 5 shows a transparent plan view and FIG. 6 shows a sectional view taken along the line A-A' of FIG. 5.

Figure 5:
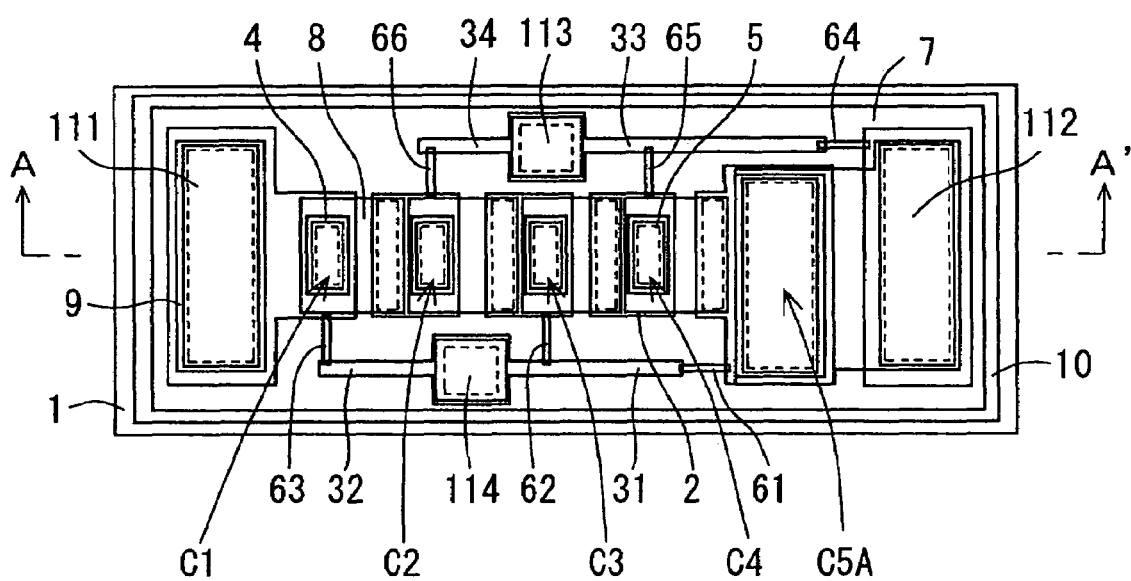
FIG. 5 is a transparent plan view showing a variable capacitor according to a third embodiment of the invention.
Figure 6:
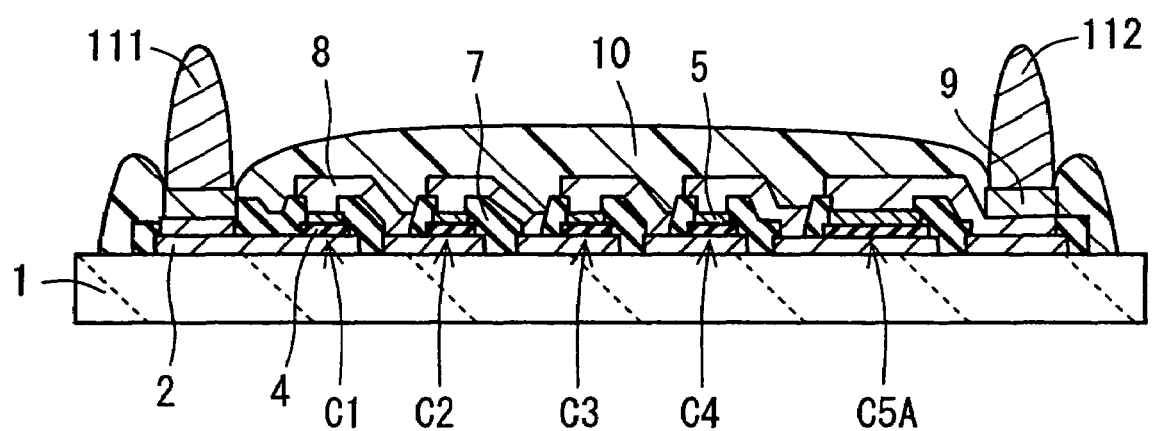
FIG. 6 is a sectional view of the variable capacitor taken along the line A-A' of FIG. 5.

In FIGS. 5 and 6, the constituent components that play the same or corresponding roles as in FIGS. 1 and 2 or FIGS. 3 and 4 will be identified with the same reference symbols, and overlapping descriptions will be omitted.

FIGS. 5 and 6 show the variable capacitor under the condition that i=1. In this embodiment, reference symbol C5A, as well as C1 through C4, represents a variable capacitance element. The variable capacitance element C5A is made larger in capacitance value than any of the other variable capacitance elements C1 through C4 at the same direct current bias voltage.

It is preferable that the capacitance of the variable capacitance element C5A is set at as large a value as possible, relatively to the capacitance values of the other variable capacitance elements C1 through C4, within the bounds of not contributing essentially to the capacitance value of the entirety of the variable capacitor. For example, as shown in FIGS. 5 and 6, in a case where five pieces of the variable capacitance elements C1 through C4 and C5A are connected in series with one another, given that the capacitance value of the variable capacitance element C5A is 25 times that of the other variable capacitance element, then the capacitance value of the variable capacitor is approximately 0.99 times the sum total of the capacitance values of the series-connected variable capacitance elements C1 through C4. Accordingly, the capacitance value of the variable capacitance element C5A does not contribute essentially to the capacitance value of the entirety of the variable capacitor.

The larger the capacitance value of the variable capacitance element C5A relatively to the capacitance values of the other variable capacitance elements C1 through C4, the more likely it is that there is no contribution to the capacitance value of the variable capacitor. In general, the capacitance value can be increased by making the capacitance forming region larger in area or by reducing the film thickness of the dielectric layer. However, in the variable capacitor of the invention, the reduction of the film thickness of the dielectric layer 4 of the variable capacitance element C5A is undesirable considering a risk of degradation in reliability in the variable capacitance element C5A. Accordingly, it is preferable that the capacitance value of the variable capacitance element C5A is made larger by increasing the area of the capacitance forming region. On the other hand, if the capacitance value of the variable capacitance element C5A is increased by increasing the area of the capacitance forming region, it is inevitable that the entire variable capacitor becomes larger in component size. This is disadvantageous in terms of miniaturization. Furthermore, as the area of the capacitance forming region is increased, the leakage current value is increased due to the direct current bias voltage applied. Therefore, depending upon the polarity of the direct current bias voltage, the leakage current of the variable capacitor is caused to vary greatly. However, the variation can be suppressed by increasing the film thickness of the dielectric layer 4 alone of the variable capacitance element C5A, or by adding an extra dielectric layer. In this case, the variable capacitance element C5A is smaller in the rate of change in capacitance than any of the other variable capacitance elements C1 through C4 at the same direct current bias voltage. In contrast to the case of increasing the capacitance of the variable capacitance element C5A solely by increasing the area of the capacitance forming region relatively to the other variable capacitance elements C1 through C4, in this case, the capacitance of the variable capacitance element C5A can be set at a larger and larger value at the same direct current bias voltage. Eventually, the capacitance value of the variable capacitor is less and less contributed by the capacitance value of the variable capacitance element C5A. In light of the foregoing, with consideration given also to the capacitor component size, the capacitance of the variable capacitance element C5A is preferably set at a value which is 5 to 30 times the capacitance values of the other variable capacitance elements.

The first electrode layer 2 of the variable capacitance element C5A is electrically connected to the second electrode layer 5 of the variable capacitance element C4 by way of the extraction electrode layer 8. On the other hand, the second electrode layer 5 of the variable capacitance element C5A is electrically connected to the second signal terminal by way of the extraction electrode layer 8. In this way, the first signal terminal, the variable capacitance elements C1 through C4 and C5A, and the second signal terminal are connected in series with one another in the order of their arrangement as specified.

According to the variable capacitor according to the third embodiment of the invention such as shown herein, the capacitance value of the variable capacitor is essentially dependent upon the capacitance values of an even number of the variable capacitance elements C1 through C4. Since the variation in capacitance characteristic that occurs depending upon the polarity of a direct current bias voltage can be cancelled out between the pair of the variable capacitance elements C1 and C3 and the pair of the variable capacitance elements C2 and C4, even if the polarity of the direct current bias voltage is reversed, the capacitance of the entirety of the variable capacitor will be unaffected and thus remain invariant. It is thus no longer necessary to take into account the polarity of the direct current bias voltage applied, wherefore the variable capacitor can be set up with facility.

Figure 7:
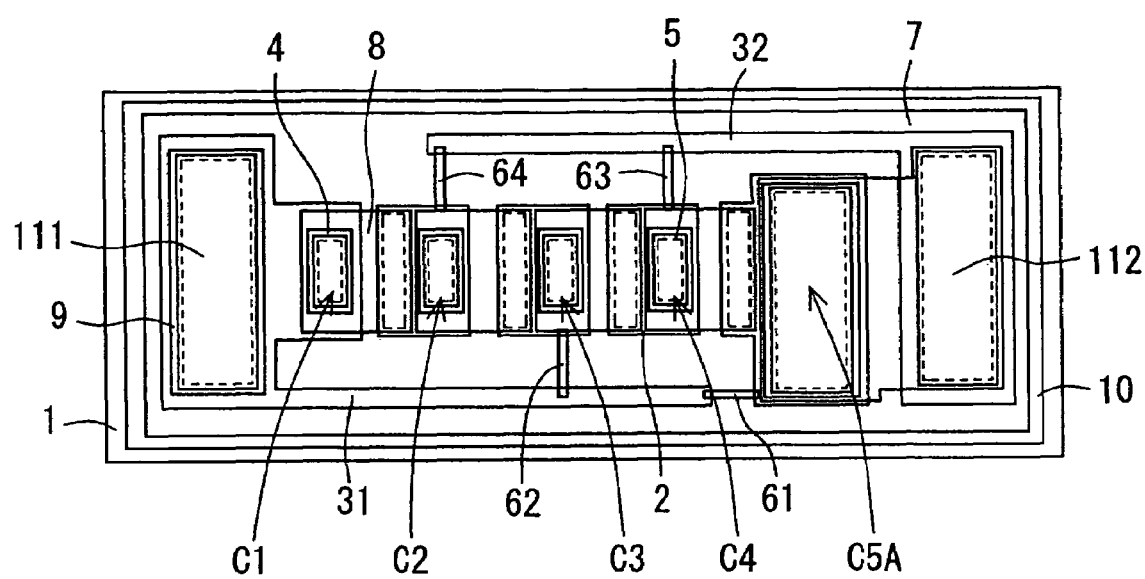
FIG. 7 is a transparent plan view showing one embodiment of a fourth variable capacitor according to a fourth embodiment of the invention.

Next, the variable capacitor according to a fourth embodiment of the invention will be described with reference to FIG. 7. FIG. 7 is a transparent plan view illustrating the variable capacitor having five pieces of series-connected variable capacitance elements.

In FIG. 7, the constituent components that play the same or corresponding roles as in FIGS. 1 and 2, FIGS. 3 and 4, or FIGS. 5 and 6, will be identified with the same reference symbols, and overlapping descriptions will be omitted.

In FIG. 7, the first bias line is composed of the conductor line 31 and the thin-film resistors 61 and 62. The conductor line 31 is connected directly to the first signal terminal. Likewise, the second bias line is composed of the conductor line 32 and the thin-film resistors 63 and 64, and is connected directly to the second signal terminal. This construction enables the shared use of a single terminal between a bias terminal for applying a direct current bias voltage and a high-frequency signal terminal. For example, in contrast to the case where the first signal terminal and the first bias terminal are provided independently of each other as shown in FIG. 1, 3, or 5, in the example shown in FIG. 7, the first signal terminal composed of the solder terminal portion 111 and the solder diffusion preventive layer 9 serves also as the first bias terminal. Similarly, in contrast to the case where the second signal terminal and the second bias terminal are provided independently of each other as shown in FIG. 1, 3, or 5, in the example shown in FIG. 7, the second signal terminal composed of the solder terminal portion 112 and the solder diffusion preventive layer 9 serves also as the second bias terminal. This eliminates the need to dispose bias terminals, wherefore the variable capacitor has the advantages of structural simplicity and downsizing.

Moreover, in FIG. 7, the thin-film resistor 61 serving as the resistance component of the bias lines is connected to the first electrode layer 2 of the variable capacitance element C5A. Likewise, the thin-film resistors 62, 63, and 64 are connected to the first electrode layers 2 of the variable capacitance elements C3, C4, and C2, respectively. In this way, the first electrode layers 2 of the variable capacitance elements C2 through C4 and C5A are connected to the first or second signal terminal in an alternating manner by way of the first or second bias line. In the variable capacitance element C1, since the first electrode layer 2 is continuously formed so as to extend to the first signal terminal, it follows that the first electrode layer 2 and the first signal terminal are at the same potential. It is thus unnecessary to connect a thin-film resistor with the first electrode layer 2 of the variable capacitance element C1. Accordingly, as compared with the case of disposing bias terminals independently, the number of the thin-film resistors can be reduced, in consequence whereof there results stabilization in the capacitance characteristic of the capacitor component.

According to the variable capacitor according to the fourth embodiment of the invention such as shown herein, like the variable capacitor according to the third embodiment of the invention, even if the polarity of a direct current bias voltage is reversed, the capacitance of the entirety of the variable capacitor will be unaffected and thus remain invariant. It is thus no longer necessary to take into account the polarity of the direct current bias voltage, wherefore the variable capacitor of the invention can be set up with facility. Moreover, in the absence of the bias terminals, the variable capacitor has the advantage of miniaturization. Further, the reduction of the number of the thin-film resistors helps stabilize the capacitance characteristic of the capacitor even further at the time of applying the direct current bias voltage.

Next, the variable capacitor according to a fifth embodiment of the invention will be described with reference to FIGS. 8 and 9.

These figures illustrate the variable capacitor having four pieces (n=2) of series-connected variable capacitance elements. FIG. 8 shows a transparent plan view and FIG. 9 shows a sectional view taken along the line A-A' of FIG. 8.

Figure 8:
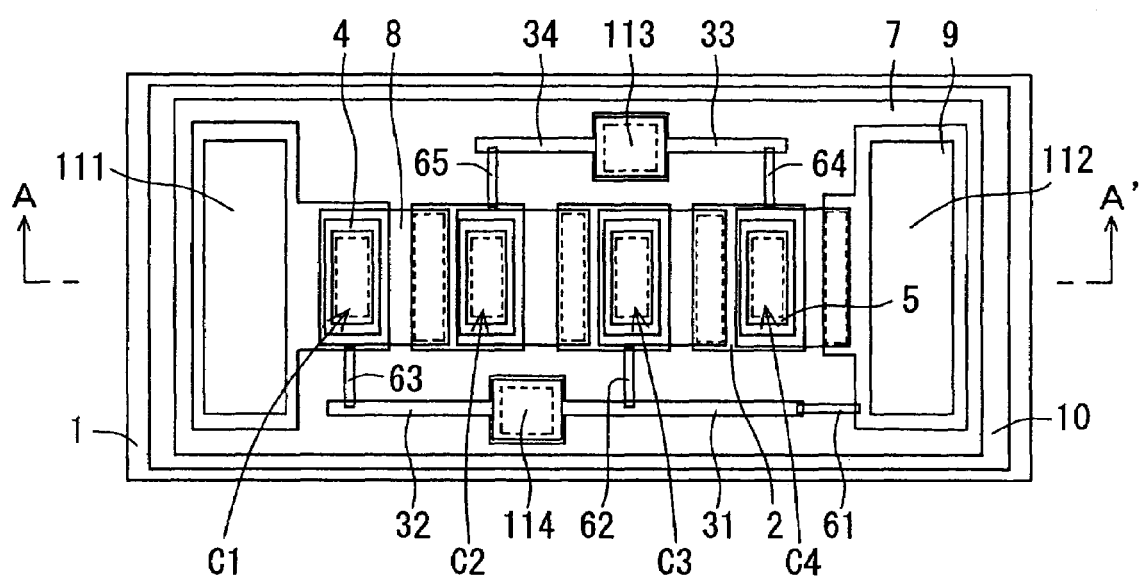
FIG. 8 is a transparent plan view showing a variable capacitor according to a fifth embodiment of the invention.
Figure 9:
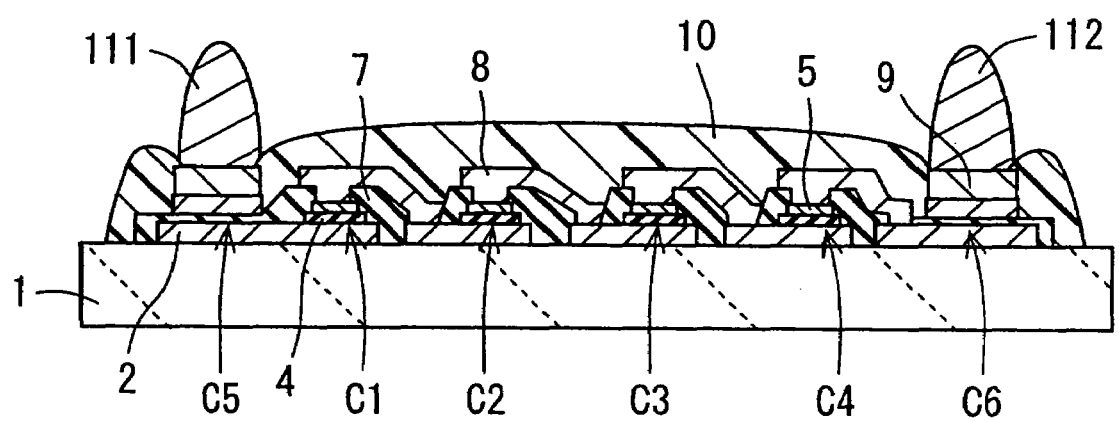
FIG. 9 is a sectional view of the variable capacitor taken along the line A-A' of FIG. 8.

In FIGS. 8 and 9, the constituent components that play the same or corresponding roles as in FIGS. 3 and 4 will be identified with the same reference symbols, and overlapping descriptions will be omitted.

In FIGS. 8 and 9, the variable capacitor comprises the direct current regulating capacitance elements C5 and C6. The direct current regulating capacitance elements C5 and C6 are formed immediately below the first and second signal terminals. The direct current regulating capacitance elements C5 and C6 each have the first electrode layer 2 formed at the position on the supporting substrate 1 where the first and second signal terminal are formed, and the insulating layer 7 serving as a dielectric layer formed on the first electrode layer 2 so as to share the second electrode layer 5 with the first and second signal terminals. Here, in order that the capacitances of the direct current regulating capacitance elements C5 and C6 reach desired level, a film thickness of the insulating layer 7 on a relevant portion needs to be made smaller. Note that, at this time, the direct current regulating capacitance elements C5 and C6 may be formed of the same dielectric substance at the same step as those of the variable capacitance elements C1 through C4 so that the first and second signal terminals are disposed on the second electrode layer 5.

By use of the first electrode layer 2 which is shared by such direct current regulating capacitance element C5 and variable capacitance element C1, the first dielectric layer 2 of the direct current regulating capacitance element C6 is connected to the second electrode layer 4 of the direct current regulating capacitance element C4 through the extraction electrode layer 8. In this way, the first signal terminal, the direct current regulating capacitance element C5, the variable capacitance elements C1 through C4, the direct current regulating capacitance element C6, and the second signal terminal are connected in series with one another in the order of their arrangement as specified.

The capacitance of the direct current regulating capacitance element C5, C6 is set at as large a value as possible within the bounds of not affecting the capacitance value of the variable capacitor operating in a high-frequency band. In this way, it is possible to attain substantially the same rate of change in capacitance as achieved in the variable capacitor having no direct current regulating capacitance elements C5 and C6.

According to the variable capacitor according to the fifth embodiment of the invention such as shown herein, there is no need to dispose any direct current regulating capacitance element on the wiring board on which the variable capacitor is mounted. This makes it possible to achieve miniaturization of the circuitry and simultaneously reduce the area on the plane for forming the direct current regulating capacitance elements so that miniaturization of the variable capacitor can be achieved.

Next, a circuit module and a communications apparatus of the invention will be explained below. The circuit module of the invention is built as a resonant circuit composed of any of the above-described variable capacitors of the invention; at least one of an inductor and a resistor; and a voltage supply section capable of applying a voltage thereto. According to the circuit module of the invention, by virtue of the variable capacitor of the invention utilized therein as a capacitor for constituting the resonant circuit, the rate of change in capacitance is sufficiently high in the capacitor and a desired capacitance can be obtained with high accuracy, so that a desired resonant frequency can be obtained in a wider frequency range with high accuracy through application of a direct current bias voltage. Moreover, with the excellence in power handling capability and independence from the polarity of a direct current bias voltage of the capacitor, the circuit module is excellent in reliability, easiness of manufacturing, and productivity.

The communications apparatus of the invention employs the above-described circuit module of the invention as filter means. For example, by using the circuit module, an inductor, a capacitor, and so forth in combination, it is possible to realize a band-pass filter. This makes it possible to determine a desired resonant frequency in a wider frequency range with high accuracy, with the result that the range of used frequencies can be widened and a desired pass band can be obtained with high accuracy. As described hereinabove, according to the communications apparatus of the invention, a desired resonant frequency can be determined in a wider frequency range with high accuracy. In the end, the filter means is operable in a wider range of frequencies, and is also capable of functioning in a desired manner with high accuracy.

Note that the invention should not be interpreted to be limited to the examples described above, and a variety of modifications and changes may be made in the invention without departing from the spirit of the invention.

For example, in the variable capacitor of the invention, it is possible to dispose each of arrays of the series-connected variable capacitance elements in a plurality of predetermined locations on the surface of the supporting substrate 1. It is also possible to constitute the first and second bias lines by the use of an inductor or a transmission line.

Moreover, in the above-described embodiments, on the supporting substrate 1 are formed the first electrode layer 2, the dielectric layer 4, and the second electrode layer 5 one after another in the order named. Instead thereof, it is possible to form, on the supporting substrate 1, the second electrode layer 5, the dielectric layer 4, and the first electrode layer 2 one after another in this order, so long as a plurality of variable capacitance elements are connected in series with one another in such a way that the first electrode layer 2 of one endmost variable capacitance element is connected to one signal terminal and the second electrode layer 5 of the other endmost variable capacitance element is connected to the other signal terminal.

Further, in the embodiment as shown in FIG. 5 or 7, in forming the insulating layer 7, in that part of the insulating layer 7 which is located at the position of the variable capacitance element C5A, instead of drilling a hole therethrough, it is possible to leave apart thereof unprocessed. On this remaining insulating-layer portion is formed the extraction electrode layer 8. This makes it possible to substantially increase the film thickness of the dielectric layer 4 of the variable capacitance element C5A, and thereby reduce the leakage current in the variable capacitance element C5A.

EXAMPLE

Hereinafter, an explanation will be given as to an actually implemented example embodying the invention.

Example 1

An explanation will be given as Example 1 as to an example embodying the variable capacitor according to the first embodiment of the invention shown in FIGS. 1 and 2.

A variable capacitor having series-connected variable capacitance elements C1 through C4 was fabricated as follows. In this construction, the capacitance elements C1 through C4 each exhibit a capacitance value of 4 pF in the absence of a direct current bias voltage, and underwent a 23% capacitive variation rate in the presence of a direct current bias voltage of 3 V.

Firstly, on a sapphire R substrate prepared as the supporting substrate 1, as the first electrode layer 2, Pt was deposited by means of sputtering at a substrate temperature of 500° C. Next, the dielectric layer 4 was formed by means of sputtering with use of a target made of $(Ba_{0.5} Sr_{0.5}) TiO_3$ at a substrate temperature of 800° C. The sputtering process was performed for 15 minutes. The dielectric layer 4 and the first electrode layer 2 were formed in the same batch. At this time, in advance of the deposition of the dielectric layer 4, annealing was carried out to level off the Pt-made first electrode layer 2 at 800° C. for 15 minutes. Subsequently, as the second electrode layer 5, Pt was deposited on the dielectric layer 4 by means of sputtering. The second electrode layer 5 and the dielectric layer 4 were formed in the same batch.

Secondly, after a photoresist coating was processed into a desired shape by means of photolithography, etching was carried out to impart a predetermined shape to the second electrode layer 5 in an ECR apparatus. Likewise, the dielectric layer 4 and the first electrode layer 2 were then processed by etching into their respective predetermined shapes. The first electrode layer 2 was so configured as to include the conductor lines 31 through 34 and the electrical conductive layers formed at the first signal terminal-placement position, the second signal terminal-placement position, the first bias terminal-placement position, and the second bias terminal-placement position, respectively.

Thirdly, as the thin-film resistors 61 through 65, tantalum nitride was deposited by means of sputtering at 100° C. Upon completion of the sputtering process, with a photoresist processed into a desired shape by means of photolithography, etching was carried out and the layer of the photoresist was removed in an RIE apparatus. Here, the thin-film resistors 61 through 65 each exhibit an aspect ratio of 20.

Fourthly, as the insulating layer 7, an $SiO_2$ film was formed by deposition in a CVD apparatus with use of TEOS gas as a raw material. Then, with a resist processed into a desired shape, etching was carried out to impart a predetermined shape to the insulating layer 7 in the RIE apparatus.

Fifthly, as the extraction electrode layer 8, Pt and Au were deposited by means of sputtering. With a resist processed into a desired shape, etching was carried out to impart a predetermined shape to the extraction electrode layer 8 in the ECR apparatus.

Lastly, the solder diffusion preventive layer 9, the passivation layer 10, and the solder terminal portions 111 through 114 were formed one after another. Here, Ni was used to form the solder diffusion preventive layer 9, and polyimide resin was used to form the passivation layer 10.

In this example, the thin-film resistor 61 to 65 has a film thickness of 43 nm, and the sheet resistance thereof was measured and found to be 510 k$\Omega$/cm². Accordingly, the thin-film resistor 61 to 65 has a specific resistance of 2 $\Omega$·cm and a resistance value of approximately 10 M$\Omega$.

Figure 10:
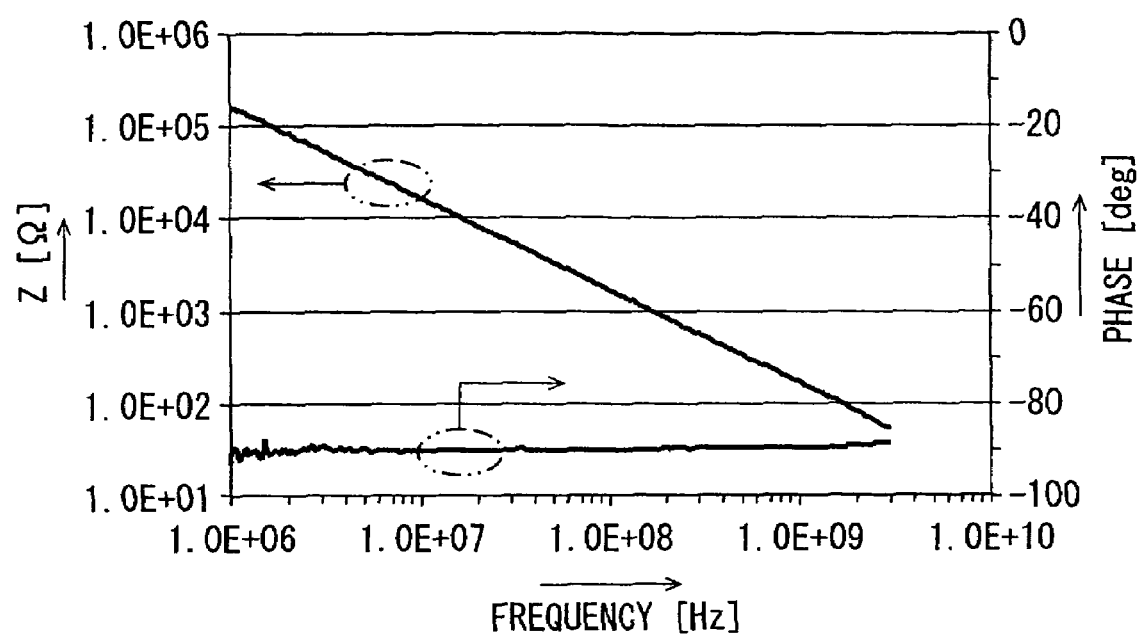
FIG. 10 is a diagram showing an example of the impedance-frequency characteristic and phase-frequency characteristic of the variable capacitor according to the first embodiment of the invention.

FIG. 10 is a diagram showing the electrical characteristic of the variable capacitor of the invention thus constructed. Here, Impedance analyzer (type E4991A: manufactured by Agilent technologies, Inc.) was used for the measurement. In FIG. 10, the frequency is taken along the horizontal axis (Frequency, unit: Hz), the impedance is taken along the left-hand vertical axis (Z, unit: $\Omega$), and the phase is taken along the right-hand vertical axis (phase, unit: deg). Note that, as for the indications shown in FIG. 10, for example, "1.0E+06" is equal to $10^6$, namely represents 1M.

As will be understood from FIG. 10, it has been confirmed that the variable capacitor of the invention is able to exhibit a normal impedance characteristic in a measurement frequency region.

Figure 11:
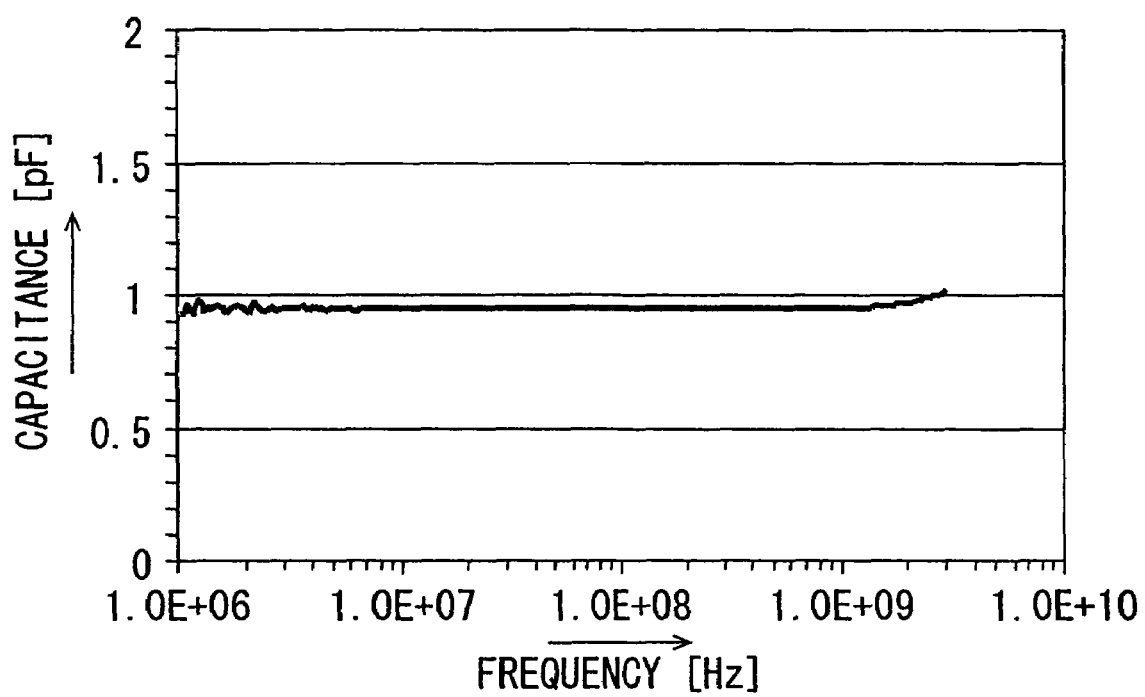
FIG. 11 is a diagram showing an example of the capacitance-frequency characteristic of the variable capacitor according to the first embodiment of the invention.

FIG. 11 is a diagram showing the measurement result of the dependence of the capacitance of the variable capacitor on the frequency. In FIG. 11, the frequency is taken along the horizontal axis (Frequency, unit: Hz) and the capacitance is taken along the vertical axis (Capacitance, unit: pF). As has been attested by the measurement result shown in FIG. 11, in the variable capacitor of the invention, the resistance of the thin-film resistors 61 through 65 included in the first and second bias lines is so high that there is no influence of the first and second bias lines on the capacitance in the measurement frequency region. Eventually, the capacitance remains substantially unchanged at 1 pF. It has thus been confirmed that the four variable capacitance elements C1 through C4 are connected in series with one another regarding a high frequency. Moreover, the rate of change in capacitance was found to be approximately 23% in the presence of a direct current bias voltage of 3 V. Given this fact, it has been confirmed that the four variable capacitance elements C1 through C4 are connected in parallel with one another regarding a direct current.

Figure 12:
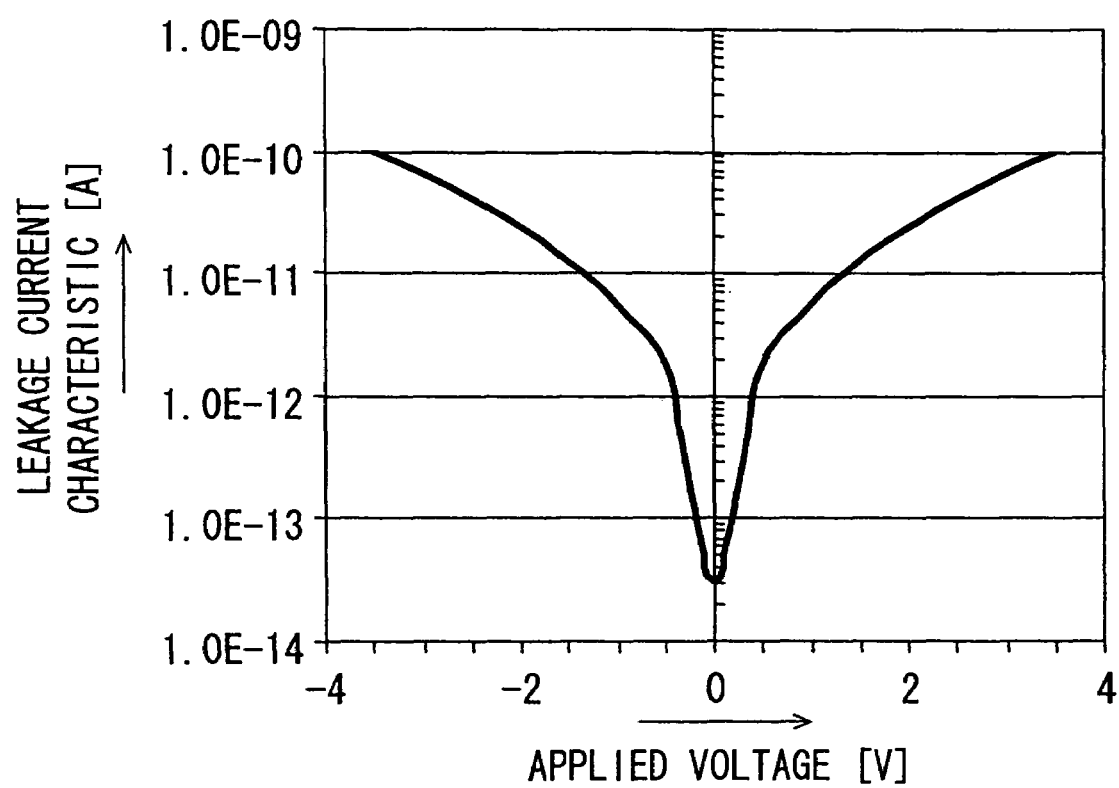
FIG. 12 is a diagram showing an example of the leakage current-applied direct current bias voltage characteristic of the variable capacitor according to the first embodiment of the invention.

FIG. 12 is a diagram showing the leakage current characteristic of the variable capacitor of the invention that has been obtained based on the above-described findings. In FIG. 12, the voltage to be applied is taken along the horizontal axis (unit: V) and the logarithmic value of the leakage current is taken along the vertical axis (unit: A). Note that, as for the indications shown in FIG. 12, for example, "1.0E−12" is equal to $10^{-12}$, namely represents 1p.

As will be understood from FIG. 12, in the variable capacitor of the invention, as one aspect of the leakage current characteristic, even if voltages of opposite polarity are applied, so long as they have the same absolute value, the leakage current value remains the same. That is, it has thus been confirmed that the leakage current characteristic of the variable capacitor of the invention is unaffected by the polarity of a direct current bias voltage.

Figure 13:
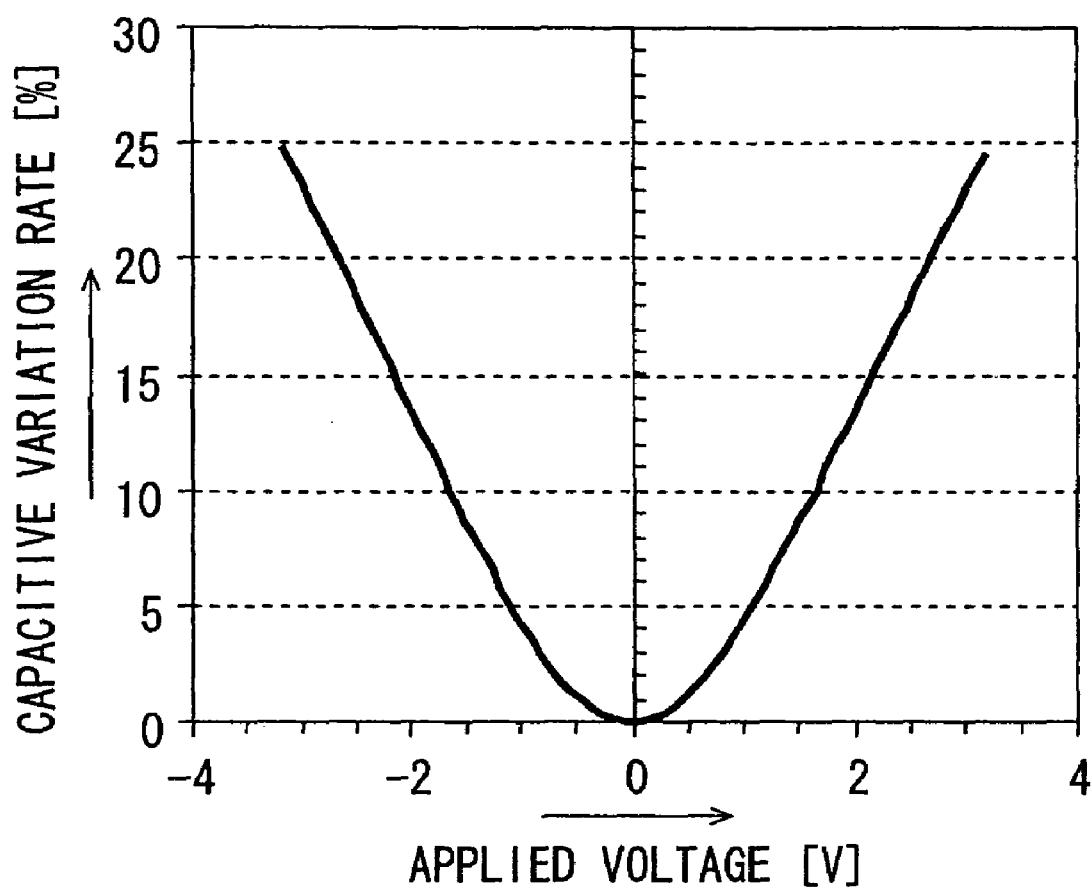
FIG. 13 is a diagram showing an example of the capacitive variation rate-applied direct current bias voltage characteristic of the variable capacitor according to the first embodiment of the invention.

FIG. 13 is a diagram showing the dependence of the rate of change in capacitance in the variable capacitor of the invention on the voltage to be applied. In FIG. 13, the voltage to be applied is taken along the horizontal axis (unit: V) and the capacitive variation rate is taken along the vertical axis (unit: %).

As will be understood from FIG. 13, in the variable capacitor of the invention, even if voltages of opposite polarity are applied, so long as they have the same absolute value, the rate of change in capacitance remains the same. That is, it has been confirmed that, in the variable capacitor of the invention, even if the polarity of a direct current bias voltage is reversed, the rate of change in capacitance remains the same.

Example 2

An explanation will be given as Example 2 as to an example embodying the variable capacitor according to the fourth embodiment of the invention shown in FIG. 7.

A variable capacitor having series-connected variable capacitance elements C1 through C4 and C5A was fabricated as follows. In this construction, the capacitance elements C1 through C4 each exhibit a capacitance value of 10 pF, whereas the capacitance element C5A exhibits a capacitance value of 250 pF, in the absence of a direct current bias voltage. Note that all of the variable capacitance elements C1 through C4 and C5A underwent a 30% capacitive variation rate in the presence of a direct current bias voltage of 3 V.

Firstly, on a sapphire R substrate prepared as the supporting substrate 1, as the first electrode layer 2, Pt was deposited by means of sputtering at a substrate temperature of 500° C. Next, the dielectric layer 4 was formed by means of sputtering with use of a target made of $(Ba_{0.5} Sr_{0.5}) TiO_3$ at a substrate temperature of 800° C. The sputtering process was performed for 15 minutes. The dielectric layer 4 and the first electrode layer 2 were formed in the same batch. At this time, in advance of the deposition of the dielectric layer 4, annealing was carried out to level off the Pt-made first electrode layer 2 at 800° C. for 15 minutes. Subsequently, as the second electrode layer 5, Pt was deposited on the dielectric layer 4 by means of sputtering. The second electrode layer 5 and the dielectric layer 4 were formed in the same batch.

Secondly, after a photoresist coating was processed into a desired shape by means of photolithography, etching was carried out to impart a predetermined shape to the second electrode layer 5 in an ECR apparatus. Likewise, the dielectric layer 4 and the first electrode layer 2 were processed by etching into their respective predetermined shapes. The first electrode layer 2 was so configured as to include the conductor lines 31 and 32 and the electrical conductive layers formed at the first signal terminal-placement position and the second signal terminal-placement position, respectively.

Thirdly, as the thin-film resistors 61 through 64, tantalum nitride was deposited by means of sputtering at 100° C. Upon completion of the sputtering process, with a photoresist processed into a desired shape by means of photolithography, etching was carried out and the layer of the photoresist was removed in an RIE apparatus. Here, the thin-film resistors 61 through 64 each exhibit an aspect ratio of 20.

Fourthly, as the insulating layer 7, an $SiO_2$ film was formed by deposition in a CVD apparatus with use of TEOS gas as a raw material. Then, with a resist processed into a desired shape, etching was carried out to impart a predetermined shape to the insulating layer 7 in the RIE apparatus.

Fifthly, as the extraction electrode layer 8, Pt and Au were deposited by means of sputtering. With a resist processed into a desired shape, etching was carried out to impart a predetermined shape to the extraction electrode layer 8 in the ECR apparatus.

Lastly, the solder diffusion preventive layer 9, the passivation layer 10, and the solder terminal portions 111 through 114 were formed one after another. Here, Ni was used to form the solder diffusion preventive layer 9, and polyimide resin was used to form the passivation layer 10.

In this example, the thin-film resistor 61 to 64 has a film thickness of 100 nm, and the sheet resistance thereof was measured and found to be 130 kΩ/square. Accordingly, the thin-film resistor 61 to 64 has a specific resistance of 1.3 Ω·cm and a resistance value of approximately 2.6 MΩ.

Figure 14:
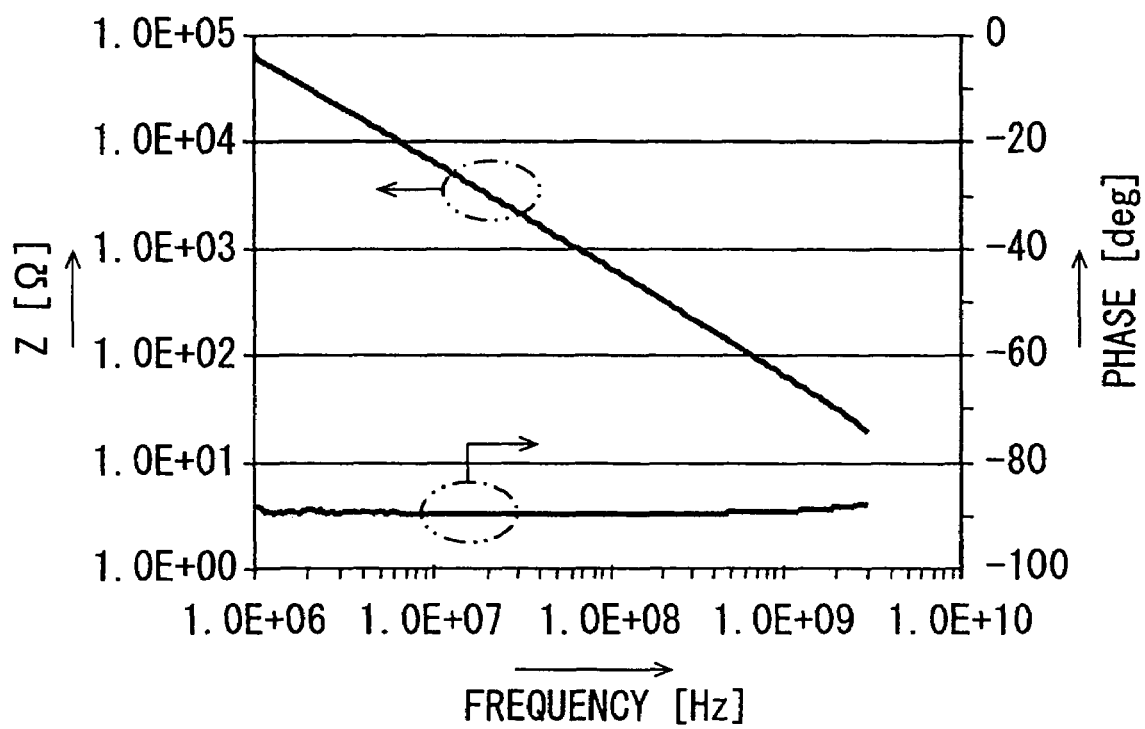
FIG. 14 is a diagram showing an example of the impedance-frequency characteristic and phase-frequency characteristic of the variable capacitor according to the fourth embodiment of the invention.

FIG. 14 is a diagram showing the electrical characteristic of the variable capacitor of the invention thus constructed. Here, Impedance analyzer (type E4991A: manufactured by Agilent technologies, Inc.) was used for the measurement. In FIG. 14, the frequency is taken along the horizontal axis (Frequency, unit: Hz), the impedance is taken along the left-hand vertical axis (Z, unit: Ω), and the phase is taken along the right-hand vertical axis (phase, unit: deg). Note that, as for the indications shown in FIG. 14, for example, "1.0E+06" is equal to $10^6$, namely represents 1M.

As will be understood from FIG. 14, it has been confirmed that the variable capacitor of the invention is able to exhibit a normal impedance characteristic in a measurement frequency region.

Figure 15:
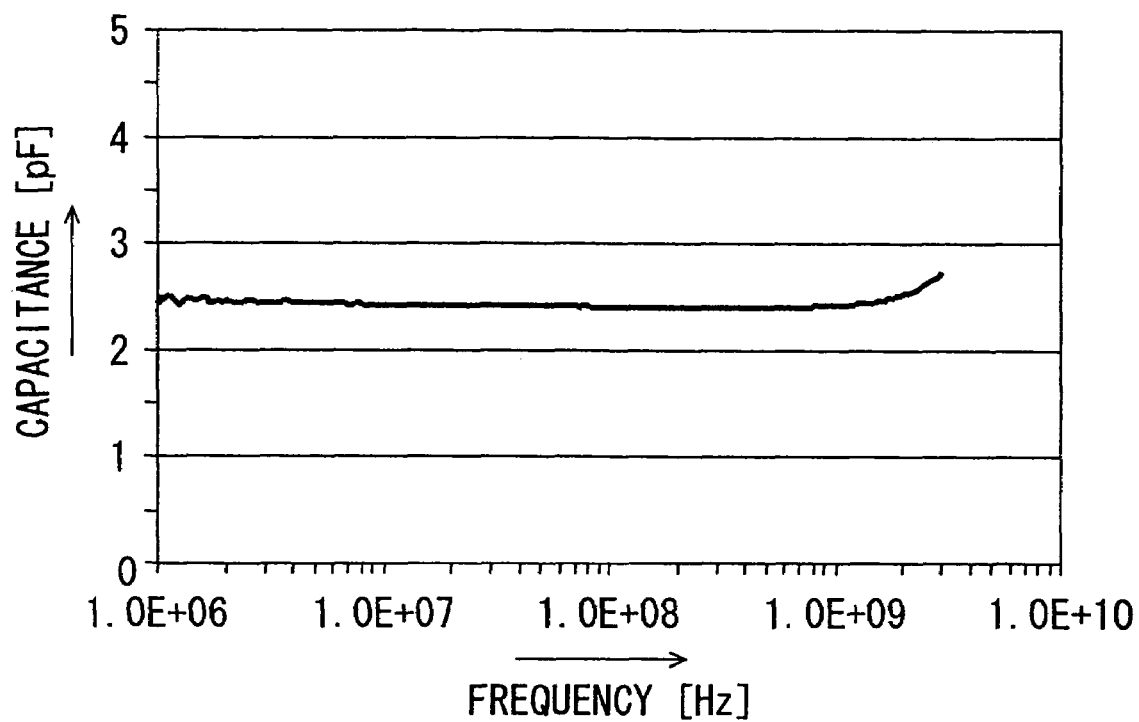
FIG. 15 is a diagram showing an example of the capacitance-frequency characteristic of the variable capacitor according to the fourth embodiment of the invention.

FIG. 15 is a diagram showing the measurement result of the dependence of the capacitance of the variable capacitor on the frequency. In FIG. 15, the frequency is taken along the horizontal axis (Frequency, unit: Hz) and the capacitance is taken along the vertical axis (Capacitance, unit: pF). As has been attested by the measurement result shown in FIG. 15, in the variable capacitor of the invention, the resistance of the thin-film resistors 61 through 64 included in the first and second bias lines is so high that there is no influence of the first and second bias lines on the capacitance in the measurement frequency region. Eventually, the capacitance remains substantially unchanged at 2.5 pF. It has thus been confirmed that the five variable capacitance elements C1 through C4 and C5A are connected in series with one another regarding a high frequency, and that the capacitance value of the variable capacitor is substantially equal to the sum total of the capacitance values of the series-connected variable capacitance elements C1 through C4 and the variable capacitance element C5A does not contribute essentially to the capacitance value of the variable capacitor. Moreover, the rate of change in capacitance was found to be approximately 30% in the presence of a direct current bias voltage of 3 V. Given this fact, it has been confirmed that the five variable capacitance elements C1 through C4, C5A are connected in parallel with one another regarding a direct current.

Figure 16:
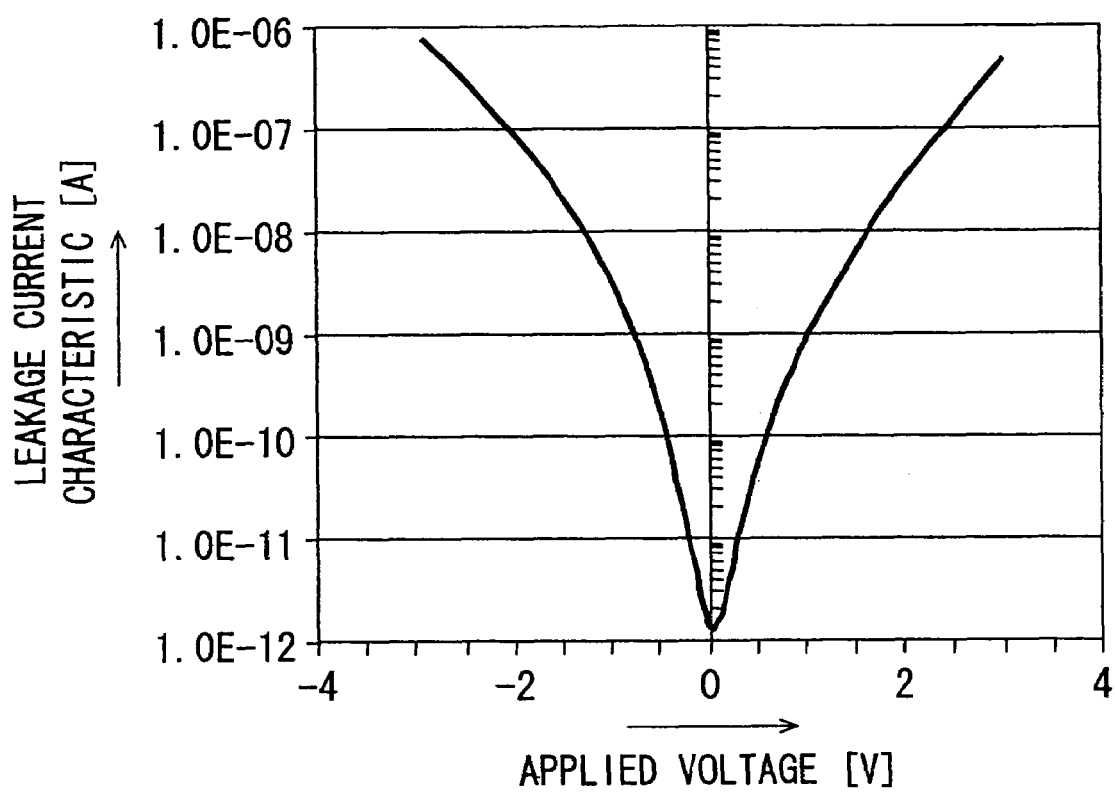
FIG. 16 is a diagram showing an example of the leakage current-applied direct current bias voltage characteristic of the variable capacitor according to the fourth embodiment of the invention.

FIG. 16 is a diagram showing the leakage current characteristic of the variable capacitor of the invention that has been obtained based on the above-described findings. In FIG. 16, the voltage to be applied is taken along the horizontal axis (unit: V) and the logarithmic value of the leakage current is taken along the vertical axis (unit: A). Note that, as for the indications shown in FIG. 16, for example, "1.0E−12" is equal to $10^{-12}$, namely represents 1p.

As will be understood from FIG. 16, in the variable capacitor of the invention, as one aspect of the leakage current characteristic, only the variation ascribable to the variable capacitance element C5A is recognizable. Although the magnitude of the leakage current corresponding to the case of applying a direct current bias voltage of negative polarity is slightly greater than that corresponding to the case of applying a direct current bias voltage of positive polarity, the difference is significantly reduced to a level that the former is just twice or below the latter, which poses no serious problem in practical use. It has thus been confirmed that the leakage current characteristic of the variable capacitor of the invention is unaffected by the polarity of a direct current bias voltage.

Figure 17:
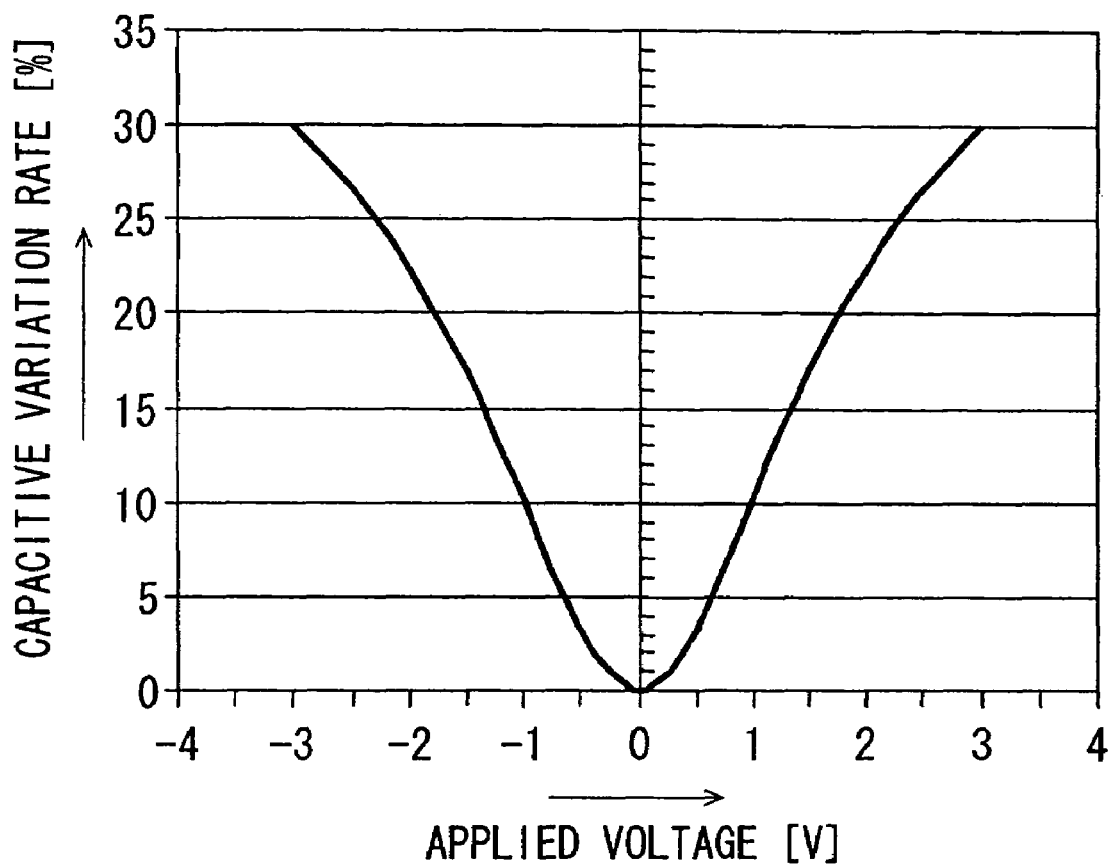
FIG. 17 is a diagram showing an example of the capacitive variation rate-applied direct current bias voltage characteristic of the variable capacitor according to the fourth embodiment of the invention.
Figure 18:
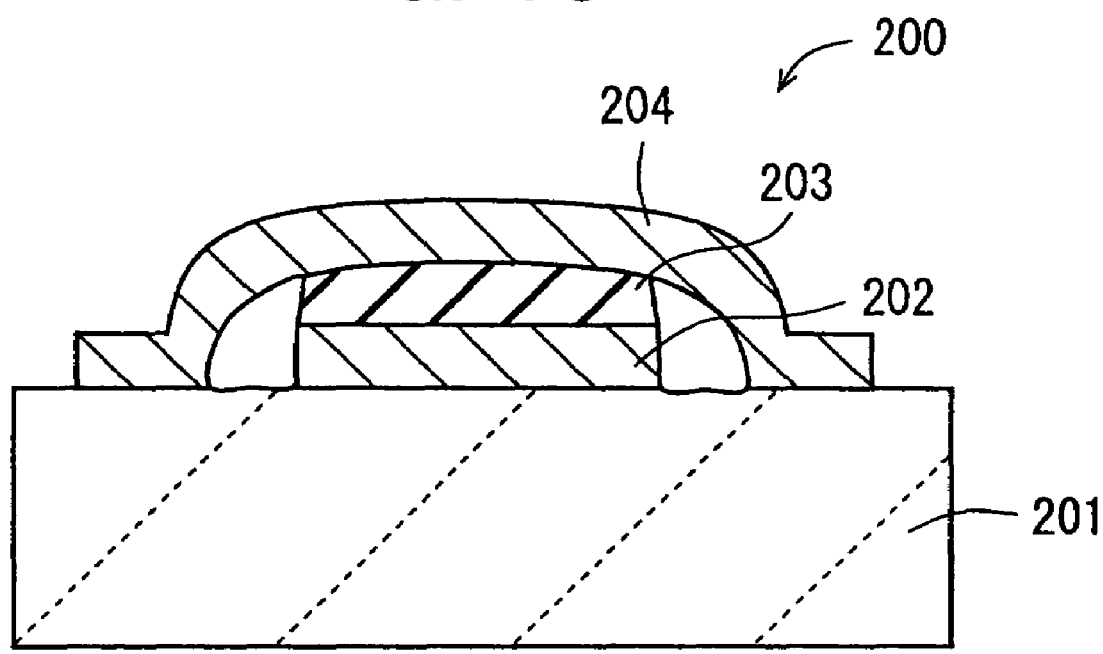
FIG. 18 is a sectional view showing a related-art variable capacitor.
Figure 19A:
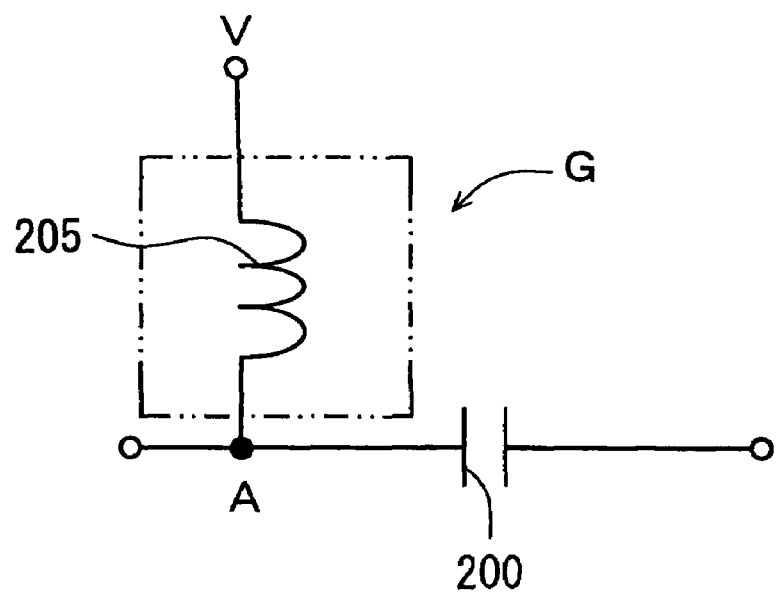
FIGS. 19A and 19B are equivalent circuit diagrams of the related-art variable capacitor.
Figure 19B:
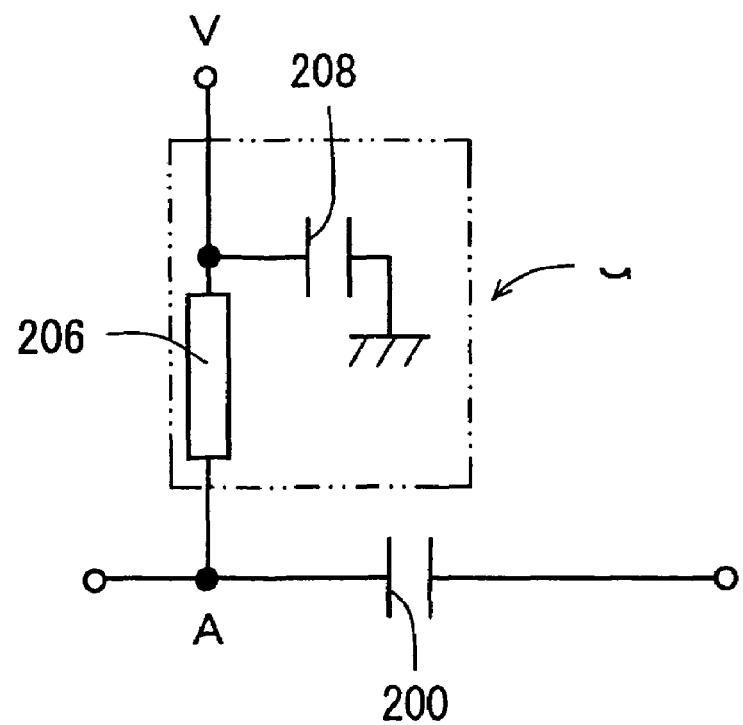

FIG. 17 is a diagram showing the dependence of the rate of change in capacitance in the variable capacitor of the invention on the voltage to be applied. In FIG. 17, the voltage to be applied is taken along the horizontal axis (unit: V) and the capacitive variation rate is taken along the vertical axis (unit: %).

As will be understood from FIG. 17, in the variable capacitor of the invention, even if voltages of opposite polarity are applied, so long as they have the same absolute value, the rate of change in capacitance remains the same. That is, it has been confirmed that, in the variable capacitor of the invention, even if the polarity of a direct current bias voltage is reversed, the rate of change in capacitance remains the same.

The invention may be embodied in other specific forms without departing from the spirit or essential characteristics thereof. The present embodiments are therefore to be considered in all respects as illustrative and not restrictive, the scope of the invention being indicated by the appended claims rather than by the foregoing description and all changes which come within the meaning and the range of equivalency of the claims are therefore intended to be embraced therein.

What is claimed is:

1. A variable capacitor comprising:
    a supporting substrate;
    a variable capacitance element array composed of a plurality of variable capacitance elements which are formed on the supporting substrate, each of the variable capacitance elements being composed of a first electrode layer and a second electrode layer facing each other, and a dielectric layer sandwiched therebetween whose dielectric constant is changeable through application of a direct current bias voltage, the second electrode layer being located farther from the supporting substrate than the first electrode layer in each of the variable capacitance elements, and the variable capacitance elements being electrically connected in series in such a manner that in each of pairs of the variable capacitance elements adjacent to each other, the first electrode layer of a first variable capacitance element of the pair and the second electrode layer of a second variable capacitance element of the pair are connected; and
    bias lines each connected to the variable capacitance elements, each of which includes at least one of resistance component and inductor component for applying the direct current bias voltage.

2. The variable capacitor of claim 1, wherein the dielectric layer is made of barium strontium titanate.

3. A circuit module comprising:
    the variable capacitor of claim 1 employed as a capacitor required for constituting a resonant circuit.

4. A communications apparatus comprising:
the circuit module of claim 3 employed as filter means.

5. A variable capacitor comprising:
a supporting substrate;
a variable capacitance element array composed of a plurality of variable capacitance elements which are formed on the supporting substrate, each of the variable capacitance elements being composed of a first electrode layer and a second electrode layer facing each other, and a dielectric layer sandwiched therebetween whose dielectric constant is changeable through application of a direct current bias voltage, the variable capacitance elements being electrically connected in series in such a manner that in each of pairs of the variable capacitance elements adjacent to each other, the first electrode layer of a first variable capacitance element of the pair and the second electrode layer of a second variable capacitance element of the pair are connected; and
bias lines each connected to the variable capacitance elements, each of which includes at least one of resistance component and inductor component for applying the direct current bias voltage;
further comprising:
a first signal terminal adapted to be connected with a first end of the variable capacitance element array;
a second signal terminal adapted to be connected with a second end of the variable capacitance element array; and
a direct current regulating capacitance element disposed between the first end of the variable capacitance element array and the first signal terminal, and/or between the second end of the variable capacitance element array and the second signal terminal.

6. The variable capacitor of claim 5, wherein the direct current regulating capacitance element is formed immediately below the first and/or the second signal terminal.

7. A variable capacitor comprising:
a supporting substrate;
a variable capacitance element array composed of a plurality of variable capacitance elements which are formed on the supporting substrate, each of the variable capacitance elements being composed of a first electrode layer and a second electrode layer facing each other, and a dielectric layer sandwiched therebetween whose dielectric constant is changeable through application of a direct current bias voltage, the variable capacitance elements being electrically connected in series in such a manner that in each of pairs of the variable capacitance elements adjacent to each other, the first electrode layer of a first variable capacitance element of the pair and the second electrode layer of a second variable capacitance element of the pair are connected; and
bias lines each connected to the variable capacitance elements, each of which includes at least one of resistance component and inductor component for applying the direct current bias voltage;
wherein a number of the variable capacitance elements is $2n+1$ (where n represents a natural number), and, of all the variable capacitance elements, the one/ones in number of $2i-1$ (where i represents a natural number equal to or smaller than n) is/are larger in capacitance value than the other variable capacitance elements at equal direct current bias voltages.

8. The variable capacitor of claim 7, further comprising:
a first signal terminal adapted to be connected with a first end of the variable capacitance element array; and
a second signal terminal adapted to be connected with a second end of the variable capacitance element array, and
wherein the bias lines are composed of first and second bias lines through which the individual first electrode layers are connected to the first and the second signal terminals in an alternating manner.

\* \* \* \* \*